United States Patent
Desclos et al.

(10) Patent No.: US 10,224,625 B2
(45) Date of Patent: Mar. 5, 2019

(54) TUNABLE MATCHING NETWORK FOR ANTENNA SYSTEMS

(71) Applicant: Ethertronics, Inc., San Diego, CA (US)

(72) Inventors: Laurent Desclos, San Diego, CA (US); Alexandre Dupuy, San Diego, CA (US); Chun-Su Yoon, San Diego, CA (US)

(73) Assignee: Ethertronics, Inc., San Diego, CA (US)

( * ) Notice: Subject to any disclaimer, the term of this patent is extended or adjusted under 35 U.S.C. 154(b) by 0 days.

(21) Appl. No.: 15/387,627

(22) Filed: Dec. 21, 2016

(65) Prior Publication Data

US 2017/0256852 A1  Sep. 7, 2017

Related U.S. Application Data

(63) Continuation of application No. 13/675,981, filed on Nov. 13, 2012, now abandoned.

(60) Provisional application No. 61/590,303, filed on Jan. 24, 2012.

(51) Int. Cl.
*H01Q 1/50* (2006.01)
*H03H 7/38* (2006.01)

(52) U.S. Cl.
CPC ............... *H01Q 1/50* (2013.01); *H03H 7/38* (2013.01)

(58) Field of Classification Search
CPC .................................. H01Q 1/50; H03H 7/38
USPC ....................................................... 333/17.3
See application file for complete search history.

(56) References Cited

U.S. PATENT DOCUMENTS

| | | |
|---|---|---|
| 6,765,536 B2 | 7/2004 | Phillips et al. |
| 6,900,773 B2 | 5/2005 | Poilasne et al. |
| 6,987,493 B2 | 1/2006 | Chen |
| 7,068,234 B2 | 6/2006 | Sievenpiper |
| 7,215,289 B2 | 5/2007 | Harano |
| 7,830,320 B2 | 11/2010 | Shamblin |
| 7,848,386 B2 | 12/2010 | Rofougaran |
| 7,911,402 B2 | 3/2011 | Rowson et al. |
| 8,325,097 B2 | 12/2012 | McKinzie et al. |
| 8,446,318 B2 | 5/2013 | Ali et al. |
| 8,447,255 B2 | 5/2013 | Asokan |
| 8,570,231 B2 | 10/2013 | Desclos |
| 8,787,845 B2 | 7/2014 | Manssen et al. |
| 9,024,700 B2 | 5/2015 | Ranta |
| 9,439,151 B2 | 9/2016 | Zhu et al. |
| 2003/0227353 A1 | 12/2003 | Fayyaz |
| 2008/0122723 A1 | 5/2008 | Rofougaran |
| 2008/0170347 A1 | 7/2008 | Rofougaran |
| 2011/0053524 A1 | 3/2011 | Manssen et al. |
| 2011/0109402 A1 | 5/2011 | Dupuy et al. |

*Primary Examiner* — Stephen E. Jones
*Assistant Examiner* — Samuel S Outten
(74) *Attorney, Agent, or Firm* — Dority & Manning, P.A.

(57) ABSTRACT

A communication system is provided, including an antenna, a matching network coupled to the antenna, a controller configured to control the matching network, and a look-up table coupled to the controller. The look-up table includes characterization data according to frequency bands and conditions. The controller is configured to refer to the look-up table to determine optimum impedance for a frequency band selected under a condition detected during a time interval, and adjust the matching network to provide the optimum impedance.

12 Claims, 34 Drawing Sheets

(A) Free Space  (B) Head  (C) Hand  (D) Head and Hand

| Condition | Band | C1 (pF) | C2 (pF) | L1 (nH) | L2 (nH) | ... |
|---|---|---|---|---|---|---|
| 1 | 1 | 0.1 | 0.5 | 0.5 | 1 | |
| 1 | 2 | 1 | 3 | 2 | 6 | |
| 1 | 3 | 2 | 5 | 10 | 15 | |
| 1 | 4 | 10 | 30 | 5 | 3 | |
| 2 | 1 | 3 | 0.1 | 3 | 7 | |
| 2 | 2 | 5 | 2 | 10 | 4 | |
| 2 | 3 | 15 | 20 | 20 | 9 | |
| 2 | 4 | 1 | 3 | 5 | 20 | |
| 3 | 1 | 6 | 5 | 0 | 30 | |
| 3 | 2 | 0 | 8 | 0 | 8 | |
| 3 | 3 | 8 | 0.5 | 15 | 0 | |
| 3 | 4 | 12 | 0 | 3 | 2 | |
| ... | | | | | | |

FIG. 7

| Topology | A | B | C | D |
|---|---|---|---|---|
| | 0.133pF | 0.266pF, 0.266pF | 0.266pF, 0.266pF | 0.532pF, 0.532pF, 0.266pF |
| P1f0 (dBm) | 13.4 | 13.43 | 13.47 | 13.48 |
| P2f0 (dBm) | -37 | -43.8 | -43.8 | -45.6 |
| P3f0 (dBm) | -37 | -49.7 | -49.7 | -53.2 |

FIG. 10

TUNABLE MATCHING NETWORK FOR ANTENNA SYSTEMS

CROSS-REFERENCE TO RELATED APPLICATIONS

This application is a continuation of U.S. application Ser. No. 13/675,981, filed Nov. 13, 2012, titled "TUNABLE MATCHING NETWORK FOR ANTENNA SYSTEMS"; which claims the benefit of priority with U.S. Provisional Application No. 61/590,303, filed Jan. 24, 2012, also titled "TUNABLE MATCHING NETWORK FOR ANTENNA SYSTEMS"; the contents of each of which are hereby incorporated by reference.

BACKGROUND

Frequency bands associated with various protocols are specified per industry standards for cell phone and mobile device applications, WiFi applications, WiMax applications and other wireless communication applications. As new generations of wireless communication devices become smaller and packed with more multiband functions, designing new types of antennas and associated air interface circuits is becoming increasingly important. In particular, a communication device with an air interface tends to be affected by use conditions such as the presence of a human hand, a head, a metal object or other interference-causing objects placed in the vicinity of an antenna, resulting in impedance mismatch and frequency shift at the antenna terminal. Accordingly, an impedance matching solution is required in the device to optimize efficiency, linearity and various other performance metrics by adjusting impedances over multiple bands using as little real estate as possible.

BRIEF DESCRIPTION OF THE DRAWINGS

FIG. 7 illustrates an example of the look-up table (LUT) according to an embodiment.

FIG. 10 is a table showing four topologies with respective output power values (in dBm).

FIG. 22A is the Smith Chart showing two impedance points, m3 and m4, corresponding to 1.8 GHz and 800 MHz, respectively, when all the five switches are on.

DETAILED DESCRIPTION OF THE PREFERRED EMBODIMENTS

A conventional communication system with a passive antenna generally is not capable of readjusting its functionality to recover optimum performances when a change in impedance detunes the antenna, causing a change in system load and a shift in frequency. A tunable antenna can be used to alleviate the perturbed properties by controlling the beam, frequency response, impedance and other antenna characteristics so as to recover the optimum performances. See, for example, U.S. Pat. No. 6,900,773, U.S. Pat. No. 7,830,320 and U.S. Pat. No. 7,911,402, which describe examples of active tunable antennas. Additionally or alternatively, a tunable matching network can be used to provide proper impedance for the use condition or the environment during the time interval based on information on the mismatch. Conventional examples include a tunable matching network described in Qiao et al., "Antenna Impedance Mismatch Measurement and Correction for Adaptive CDMA Transceivers," Microwave Symposium Digest, IEEE MTT-S International, June 2005, pp. 783-786, and a method and apparatus for digitally tuning the capacitance of integrated circuit components described in the U.S. patent application Ser. No. 12/735,954 to Ranta.

Figure 1:
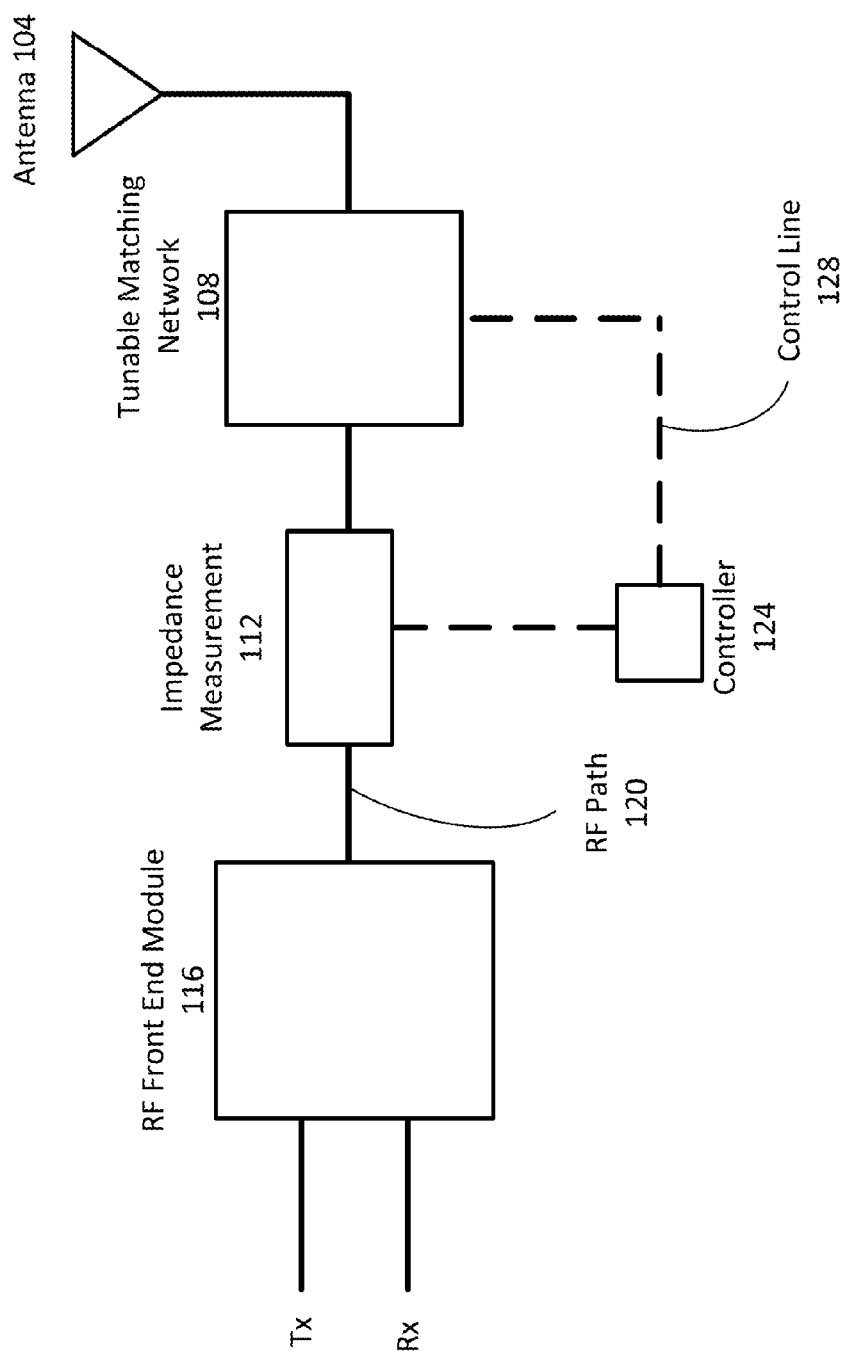
FIG. 1 illustrates an example of a conventional communication system including a tunable matching network.

FIG. 1 illustrates an example of a conventional communication system including a tunable matching network. This system includes an antenna 104, which is a single antenna for transmit (Tx) and receive (Rx) in this case, a tunable matching network 108, an impedance measurement section 112, and an RF front end module 116. These components and modules are coupled to each other through an RF path 120. The RF front end module 116 may include a duplexer to split the RF path 120 into a Tx path and an Rx path, a power amplifier coupled to the Tx path, a low noise filter coupled to the Rx path, and various other components and modules to process the RF signals. The impedance measurement section 112 measures impedances and send the information to a controller 124, which is configured to control the components in the tunable matching network 108 via a control line 128 to adjust the impedance.

Figure 1A:
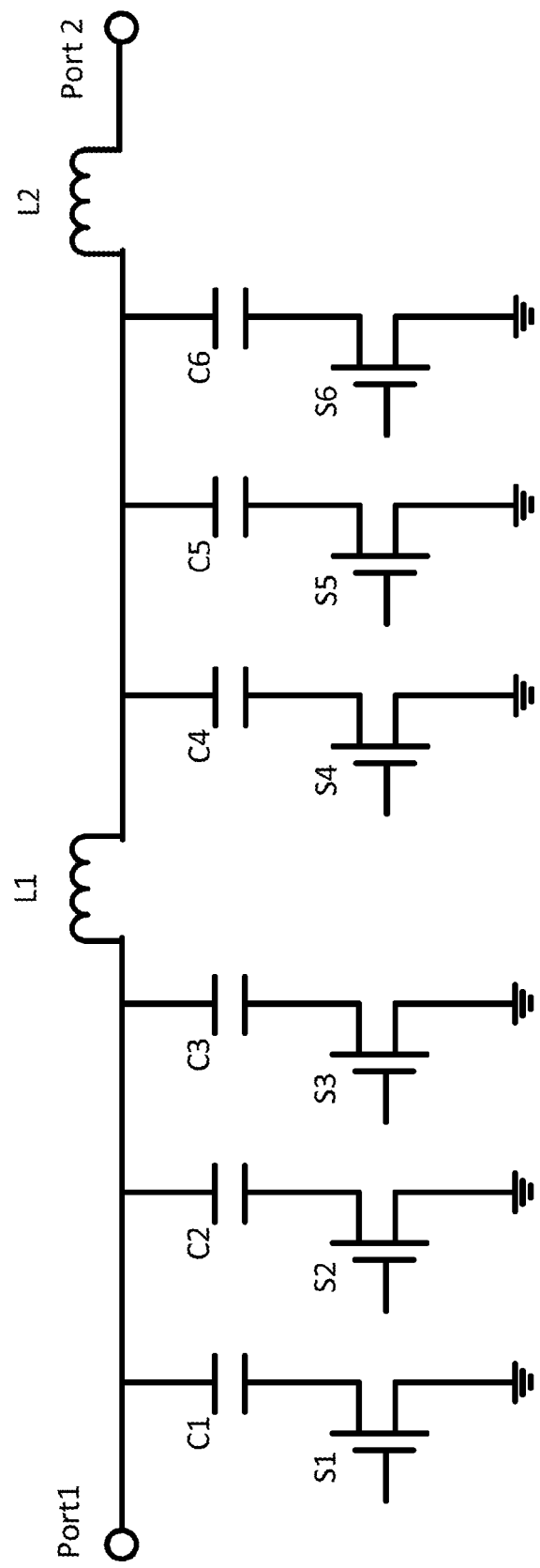
FIG. 1A illustrates an example of a conventional tunable matching network.

FIG. 1A illustrates an example of a conventional tunable matching network 108. Two ports, port 1 and port 2, are used to couple to the RF path 120. This particular example includes six capacitors, C1, C2 . . . and C6, six switches S1, S2 . . . and S6, and two inductors L1 and L2. Each capacitor is coupled to a switch in series having one end coupled to the ground, thereby forming a shunt configuration. Two inductors L1 and L2 are coupled to the RF path 120 in series. The gate (or base) terminals of the switches are controlled by the controller 124. By turning on one or more switches among the six switches, this tunable matching network can provide 64 ($2^6$) possible capacitance states. Depending on the measured impedance, the switches are turned on or off to reduce the impedance mismatch. Fixed capacitances are selected to provide a relatively uniform distribution over the Smith Chart. The best state is selected for a particular mismatch circumstance as detected by the impedance measurement section 112.

Figure 2:
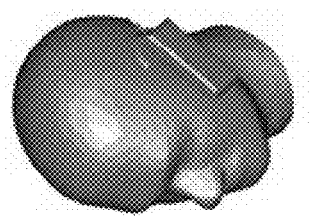
FIG. 2 illustrates four different scenarios that a mobile device may encounter, together with the respective Smith charts. Two points in the Smith chart correspond to impedances for two different frequencies
Figure 2:
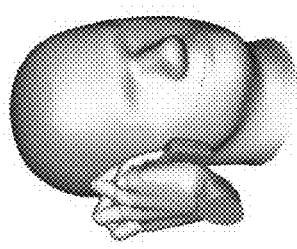
Figure 2:
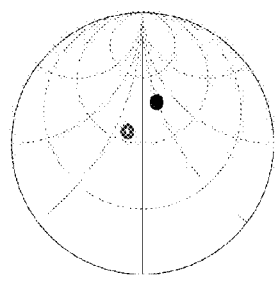
Figure 2:
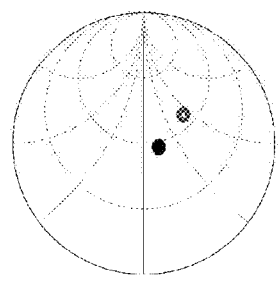
Figure 2:
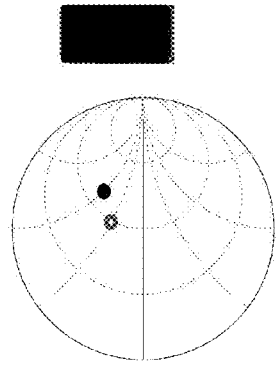
Figure 2:
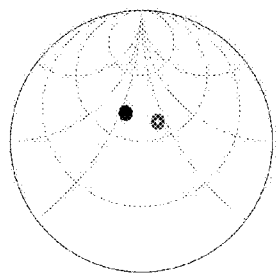
Figure 2:
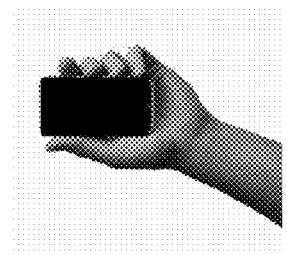

Impedance matching is an important design procedure for optimizing system performances. FIG. 2 illustrates four different scenarios that a mobile device, such as a cellular phone, may encounter, together with the respective Smith charts. Two points in the Smith chart correspond to impedances for two different frequencies. The scenario (A) represents the case in which the mobile device is in free space; the scenario (B) represents the case in which a human head is touching the mobile device; the scenario (C) represents the case in which the mobile device is held by a human hand; and the scenario (D) represents the case in which both a head and a hand are touching the mobile device. The two points in the Smith chart in each of the scenarios (B), (C) and (D) are shifted from the positions in the free space (A) due to the loading and detuning effects caused by the perturbations toward the antenna. Therefore, in these scenarios, the antenna system needs to be readjusted to work with different impedances for optimum efficiency.

This document describes a flexible and tailored matching scheme capable of maintaining the optimum system performances for various frequency bands, conditions, environments and surroundings. In particular, the present matching scheme provides matching network configurations having impedance values tailored for individual scenarios. This scheme is fundamentally different from a conventional scheme of providing beforehand impedance values corresponding to discrete points in the Smith chart based on combinations of fixed capacitance values, which may be unnecessarily excessive, wasting real estate, and/or missing optimum impedance values. Specifically, in the conventional fixed-capacitance scheme, termed a binary scheme herein, the capacitors and switches are binary-weighted from a least significant bit (LSB) to a most significant bit (MSB). On the other hand, in the present tailored scheme, impedance values are optimized in advance according to frequency bands and detectable conditions including use conditions and environments.

Figure 3:
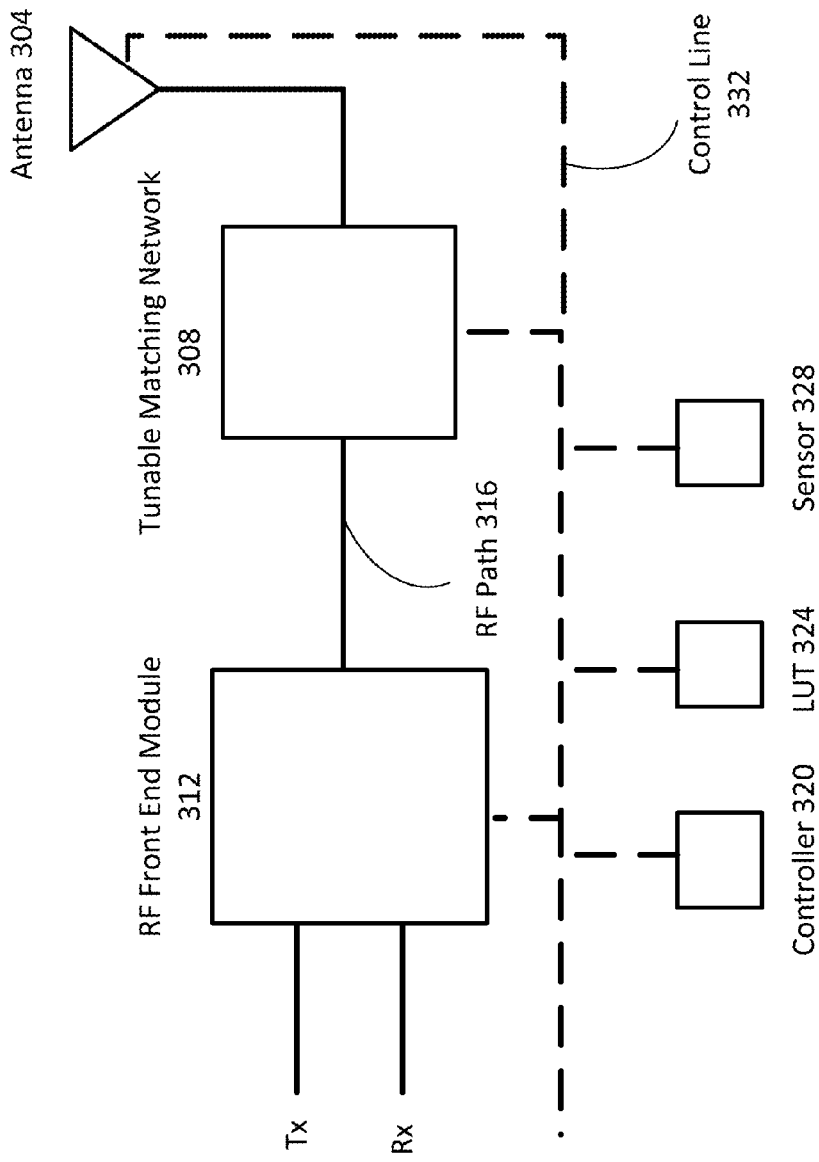
FIG. 3 illustrates an example of a communication system according to an embodiment.

FIG. 3 illustrates an example of a communication system according to an embodiment. This system includes an antenna 304, which is a single antenna for transmit (Tx) and receive (Rx) in this example, a tunable matching network 308, and an RF front end module 312. These components and modules are coupled to each other through an RF path 316. The RF front end module 312 may include a duplexer to split the RF path 316 into a Tx path and an Rx path, a power amplifier coupled to the Tx path, a low noise filter coupled to the Rx path, and various other components and modules to process the RF signals. A controller 320, a look-up table (LUT) 324 and a sensor 328 are coupled to each other through a control line 332, enabling the controller 320 to adjust the tunable matching network 308 based on input information. The sensor 328 may include one or more sensors such as a proximity sensor, a motion sensor, a light sensor, a pressure sensor or other types of sensors, to detect the use condition or the environment and send the detected information to the controller 320. The controller 320 is configured to include an algorithm to control the components in the tunable matching network 308 to adjust the impedance. Additionally, the components and modules in the RF front end module 312 may be controlled by the controller 320 for optimal signal processing. Furthermore, the controller 320 may be configured to control, in addition to the modules and components in the RF front end module 312 and in the tunable matching network 308, the antenna 304 if an active tunable antenna is used. The controller 320 may be located anywhere in the system, and may be integrated with the antenna 304, with the tunable matching network 308 or with the RF front end module 312. The tunable matching network 308 may be integrated with the antenna 304 or with the RF front end module 312. The LUT 324 tabulates measured and/or predetermined data associated with antenna characteristics, and the algorithm is configured to optimize the system performance based on the entries in the LUT 324 according to time-varying conditions, such as perturbations due to the placement of a head, a hand, or other interference-causing objects nearby. The entries in the LUT 324 can be updated as needed, and the LUT 324 may be stored in a memory of the controller 320 or located outside the controller 320. The controller 320 and/or the LUT 324 can be implemented using a logic chip, such as a field-programmable gate array (FPGA), which supports thousands of gates, providing vast design flexibility. Alternatively, an application specific integrated circuit (ASIC) can also be used.

Bidirectional control can be realized, for example, by using an interface specified by the Mobile Industry Processor Interface (MIPI) Alliance, General Purpose Input/Output (GPIO), Serial Parallel Interface (SPI), or Inter-Integrated Circuit ($I^2C$). See, for example, a white paper entitled "Tuning Technology: Key Element to Lower Operating Costs While Improving Wireless Network Performance," released on Feb. 8, 2011, by IWPC (International Wireless Industry Consortium). The control lines 332 may be designed to incorporate such bidirectional control using a conventional bus, wires, or other suitable forms.

Figure 4A:
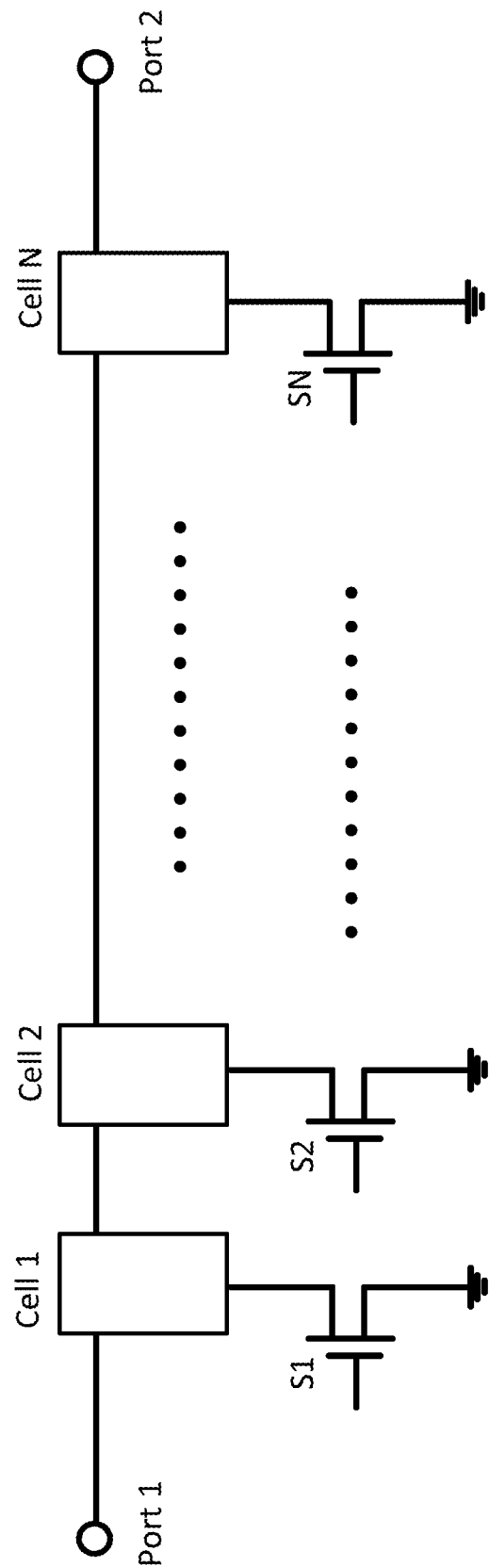
FIGS. 4A-4I illustrate examples of the tunable matching network according to embodiments.

FIG. 4A illustrates an example of the tunable matching network 308 according to an embodiment. This example includes multiple switches S1, S2 . . . and SN as well as cell 1, cell 2 . . . and cell N. Each cell is coupled to a switch in series having one end coupled to the ground. The present matching network 308 has two ports, port 1 and port 2, which may be coupled to the RF path 316. Each cell may include one or more components such as capacitors and/or inductors. The gate (or base) terminals of the switches S1, S2 . . . and SN are controlled by the controller 320. By turning on one or more of the switches, this tunable matching network can provide multiple impedance states needed for matching various detuned scenarios.

Figure 4B:
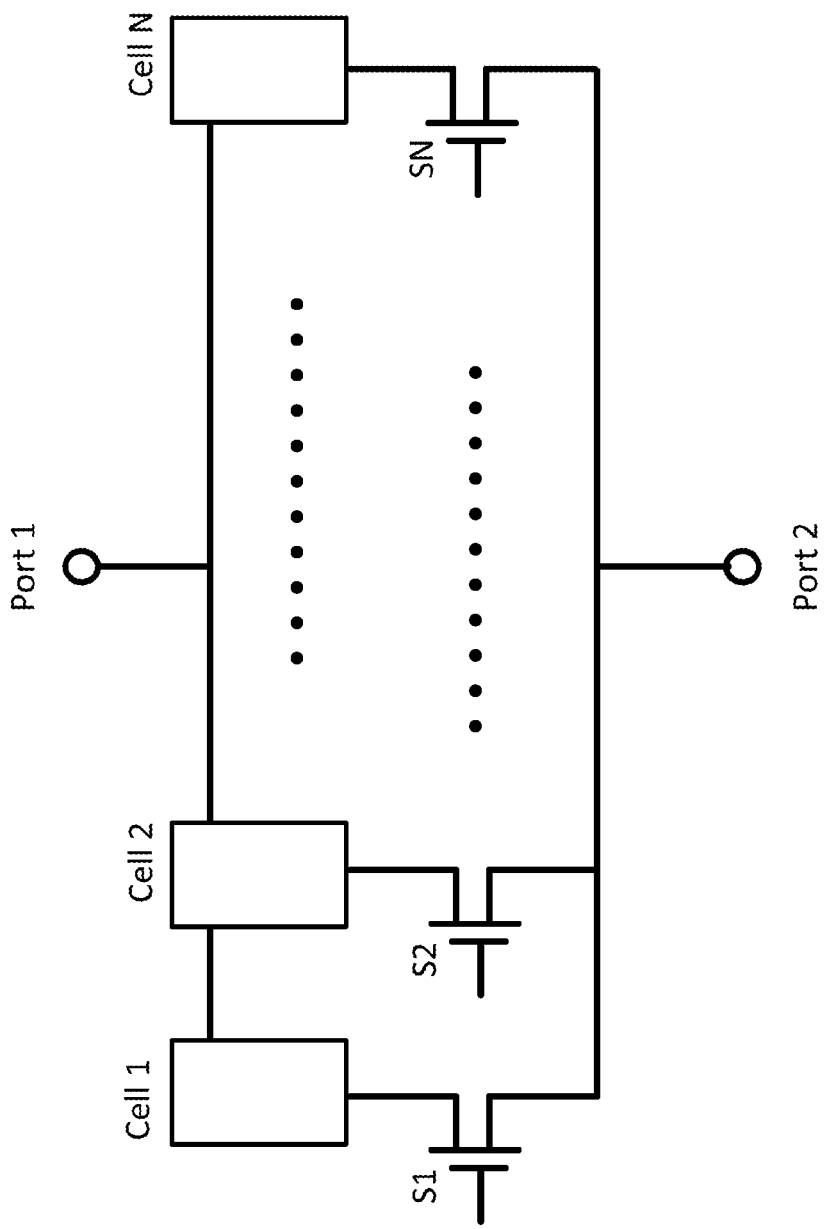

FIG. 4B illustrates another example of the tunable matching network 308 according to an embodiment. As in the example of FIG. 4A, this configuration includes multiple switches S1, S2 . . . and SN coupled to cell 1, cell 2 . . . and cell N, respectively, in series. Multiple pairs of a switch and a cell are coupled in parallel, with one end having port 1 and the other end having port 2, which may be coupled to the RF path 316. Each cell may include one or more components such as capacitors and/or inductors. The gate (or base) terminals of the switches S1, S2 . . . and SN are controlled by the controller 320. By turning on one or more of the switches, this tunable matching network can provide multiple impedance states needed for matching various detuned scenarios.

Figure 4C:
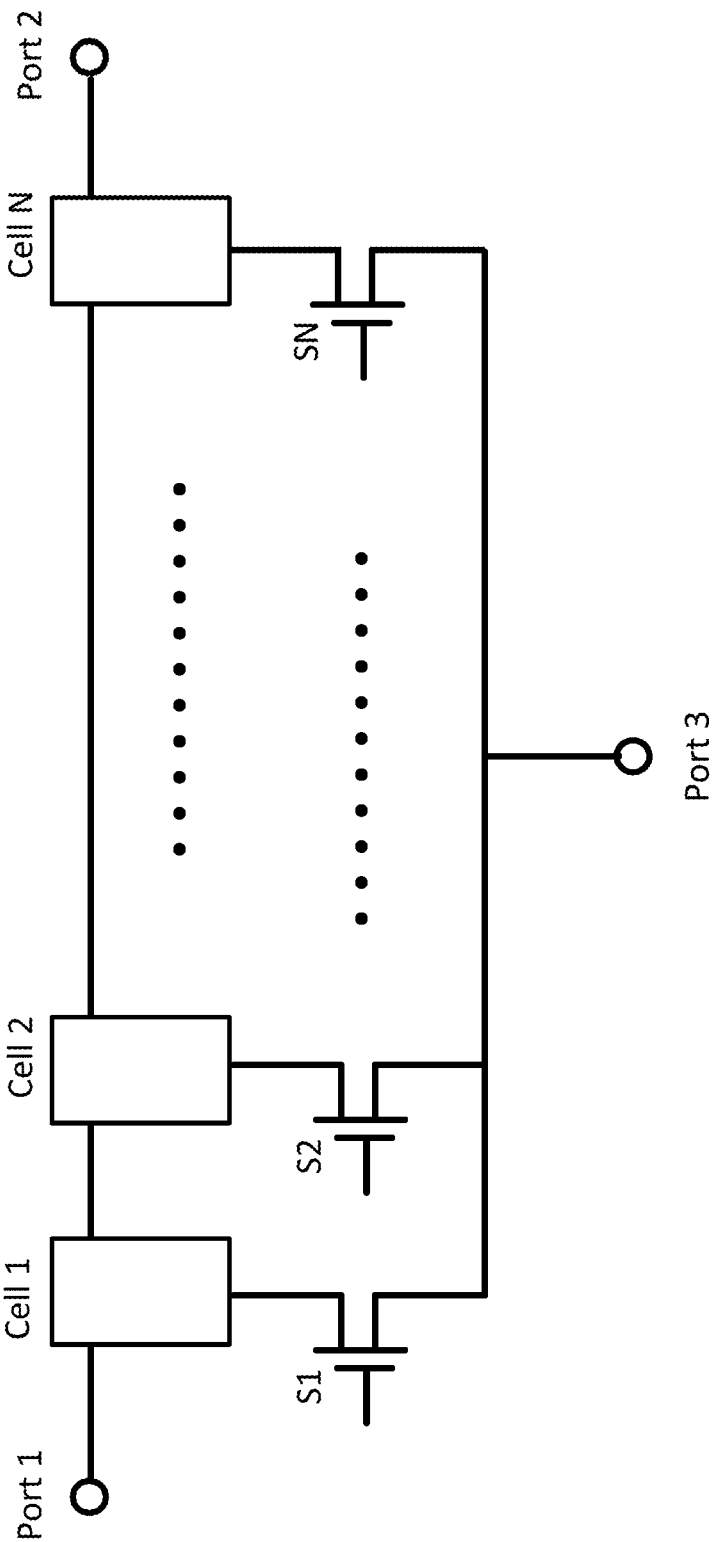

FIG. 4C illustrates yet another example of the tunable matching network 308 according to an embodiment. As in the examples of FIGS. 4A and 4B, this configuration includes multiple switches S1, S2 . . . and SN coupled to cell 1, cell 2 . . . and cell N, respectively, in series. Three ports, port 1, port 2 and port 3, are provided in this case, allowing for the flexibility of selecting two out of the three ports to be coupled to the RF path 316 with an option of coupling the remaining port to another circuit, module or component in the system, shorting it to ground or keeping it open. Each cell may include one or more components such as capacitors and/or inductors. The gate (or base) terminals of the switches S1, S2 . . . and SN are controlled by the controller 320. By turning on one or more of the switches, this tunable matching network can provide multiple impedance states needed for matching various detuned scenarios.

Figure 4D:
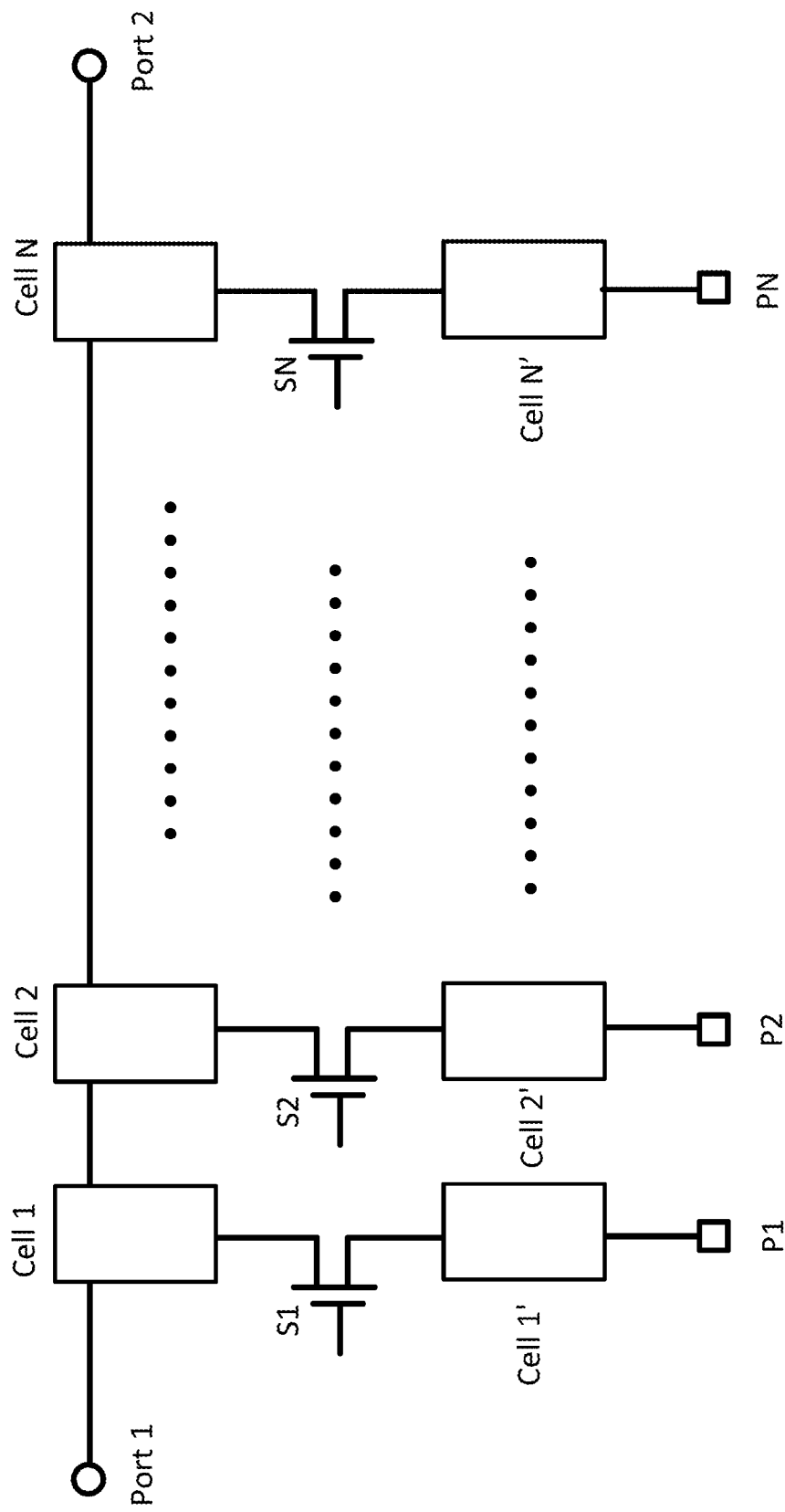

FIG. 4D illustrates yet another example of the tunable matching network 308 according to an embodiment. This example includes multiple switches S1, S2 . . . and SN, cell 1, cell 2 . . . and cell N, and cell 1', cell 2' . . . and cell N'. Each switch is coupled to a first cell on one side and a second cell on the other side in series. The present matching network 308 has two ports, port 1 and port 2, which may be coupled to the RF path 316. The first cell of each series is coupled to the path coupled to port 1 and port 2, and the second cell of each series has an end portion Pi, where 1≤i≤N. Each of the end portions, P1, P2 . . . and PN, can be shorted to ground or open. Each cell may include one or more components such as capacitors and/or inductors. The gate (or base) terminals of the switches S1, S2 . . . and SN are controlled by the controller 320. By turning on one of the switches, this tunable matching network can provide N possible impedance states, which are determined by the combinations of cell 1+cell 1', cell 2+cell 2' . . . and cell N+cell N'. Additional impedance states can be provided by turning on two or more switches.

Figure 4E:
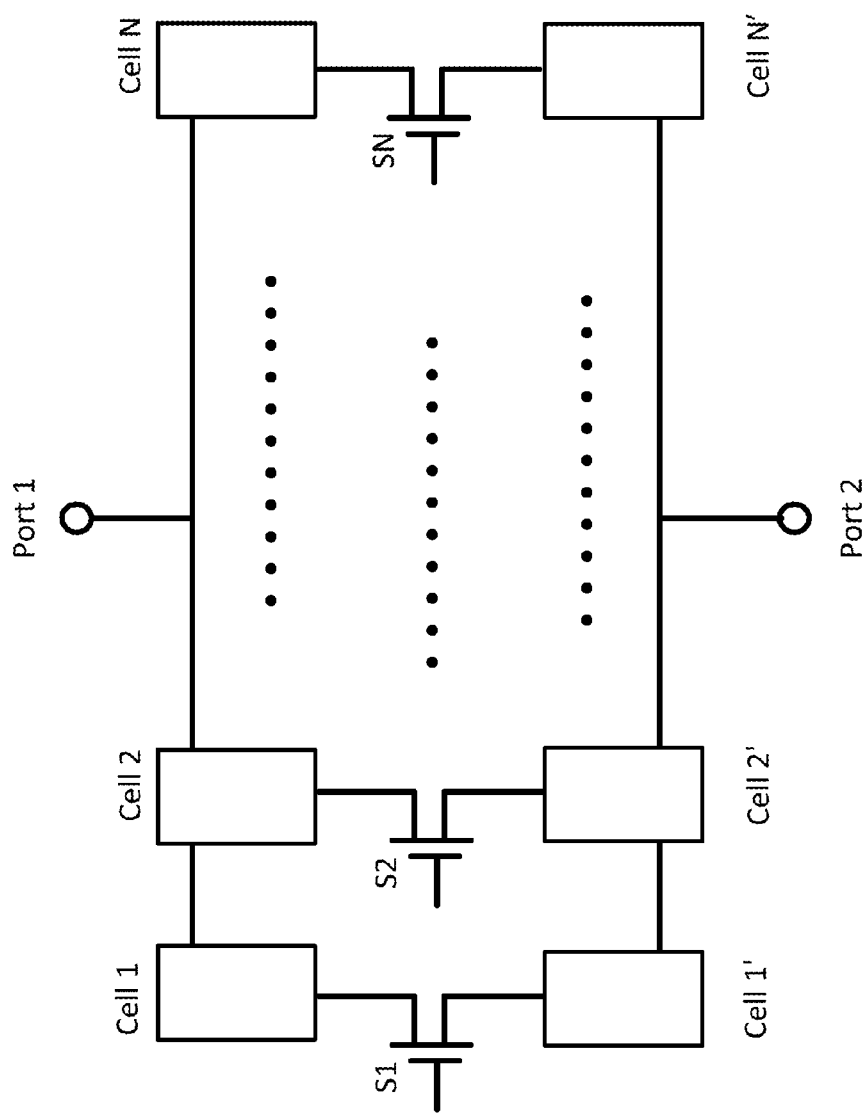

FIG. 4E illustrates yet another example of the tunable matching network 308 according to an embodiment. As in the example of FIG. 4D, this configuration includes multiple switches S1, S2 . . . and SN, cell 1, cell 2 . . . and cell N, and cell 1', cell 2' . . . and cell N'. Each switch is coupled to a first cell on one side and a second cell on the other side in series. These multiple series are coupled in parallel, with one end having port 1 and the other end having port 2, which may be coupled to the RF path 316. Each cell may include one or more components such as capacitors and/or inductors. The gate (or base) terminals of the switches S1, S2 . . . and SN are controlled by the controller 320. By turning on one of the switches, this tunable matching network can provide N possible impedance states, which are determined by the combinations of cell 1+cell 1', cell 2+cell 2' . . . and cell N+cell N'. Additional impedance states can be provided by turning on two or more switches.

Figure 4F:
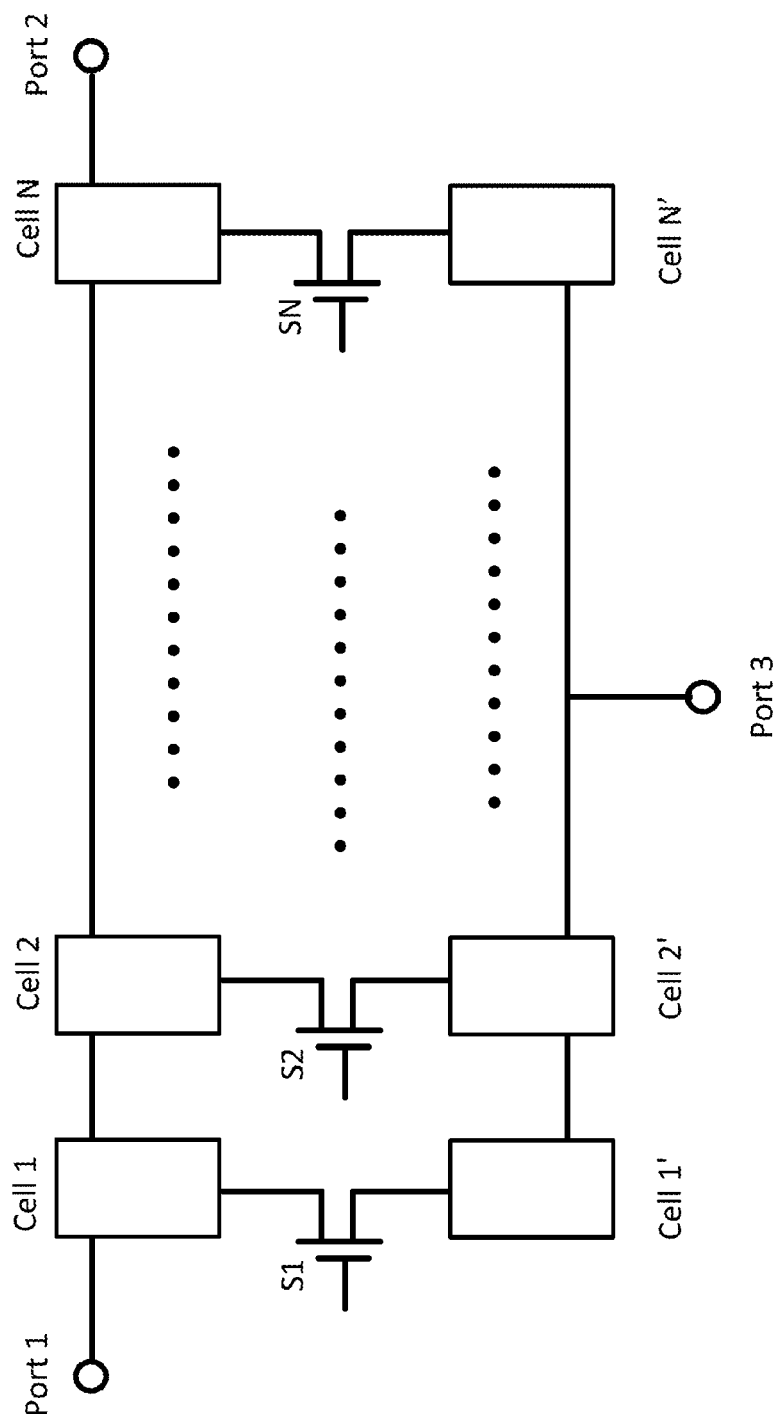

FIG. 4F illustrates yet another example of the tunable matching network 308 according to an embodiment. As in the examples of FIGS. 4D and 4E, this configuration includes multiple switches S1, S2 . . . and SN, cell 1, cell 2 . . . and cell N, and cell 1', cell 2' . . . and cell N'. Each switch is coupled to a first cell on one side and a second cell on the other side in series. Three ports, port 1, port 2 and port 3, are provided in this case, allowing for the flexibility of selecting two out of the three ports to be coupled to the RF path 316 with an option of coupling the remaining port to another circuit, module or component in the system, shorting it to ground or keeping it open. Each cell may include one or more components such as capacitors and/or inductors. The gate (or base) terminals of the switches S1, S2 . . . and SN are controlled by the controller 320. By turning on one of the switches, this tunable matching network can provide N possible impedance states, which are determined by the combinations of cell 1+cell 1', cell 2+cell 2' . . . and cell N+cell N'. Additional impedance states can be provided by turning on two or more switches.

Figure 4G:
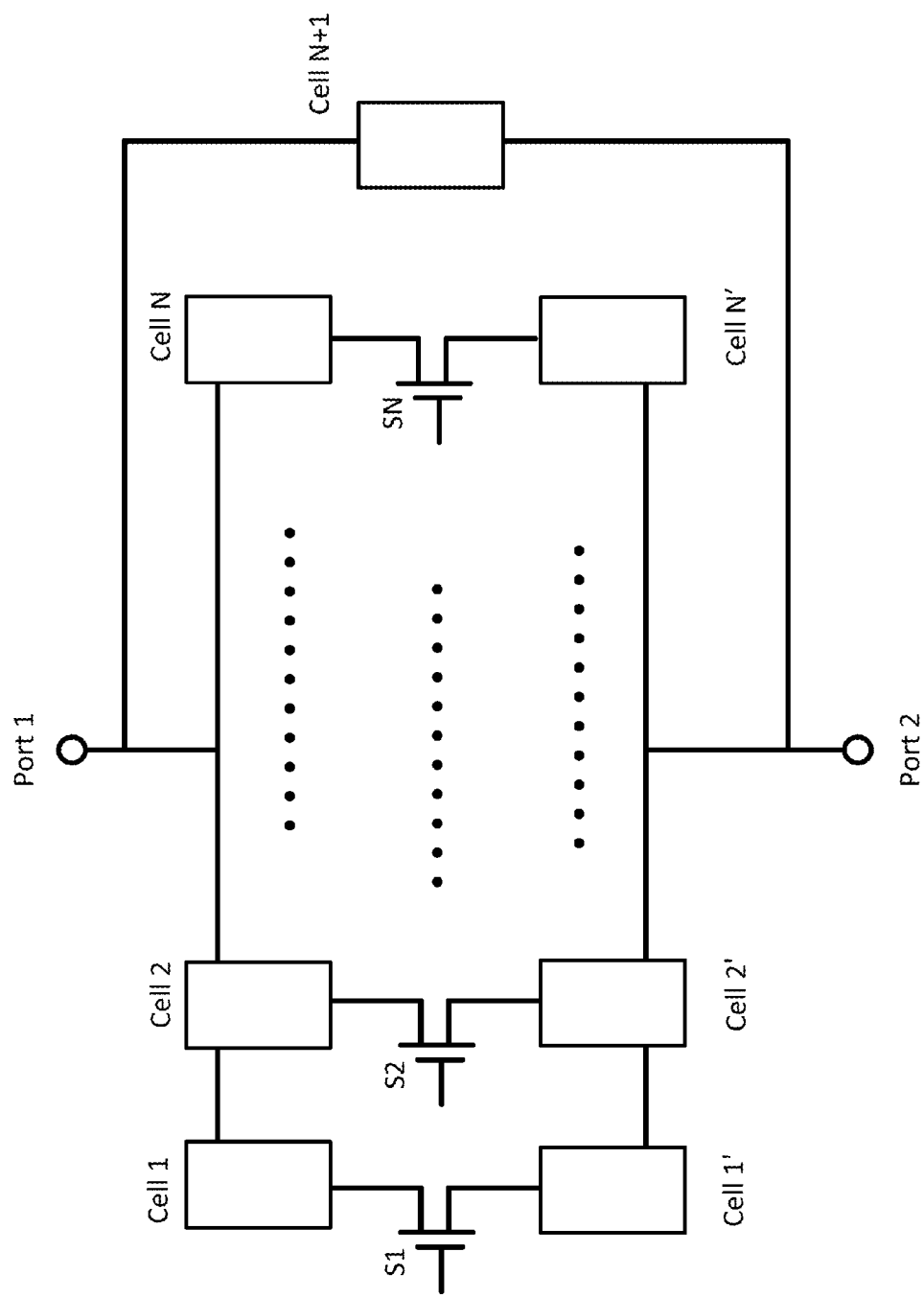

FIG. 4G illustrates yet another example of the tunable matching network 308 according to an embodiment. This configuration includes a path having one cell, i.e., cell N+1, directly coupled to port 1 and port 2 without a switch. This path is additional to a base configuration having switches in respective paths, such as the configurations illustrated in FIGS. 4A-4F. Although the base configuration of FIG. 4E is used in this example of FIG. 4G, any one of or a combination of the base configurations of FIG. 4A-4F as well as the later examples can be used. The additional cell, i.e., cell N+1, may include one or more components such as capacitors and/or inductors to provide an impedance value corresponding to a nominal situation. The cell N+1 can be kept ON to handle the nominal situation, and depending on the conditions, one or more of the switches in the base configuration can be turned on to adjust the impedance. Thus, this configuration in FIG. 4G leads to reduced power consumption and better efficiency since a switch, which is generally lossy, is unused for the nominal situation.

Figure 4H:
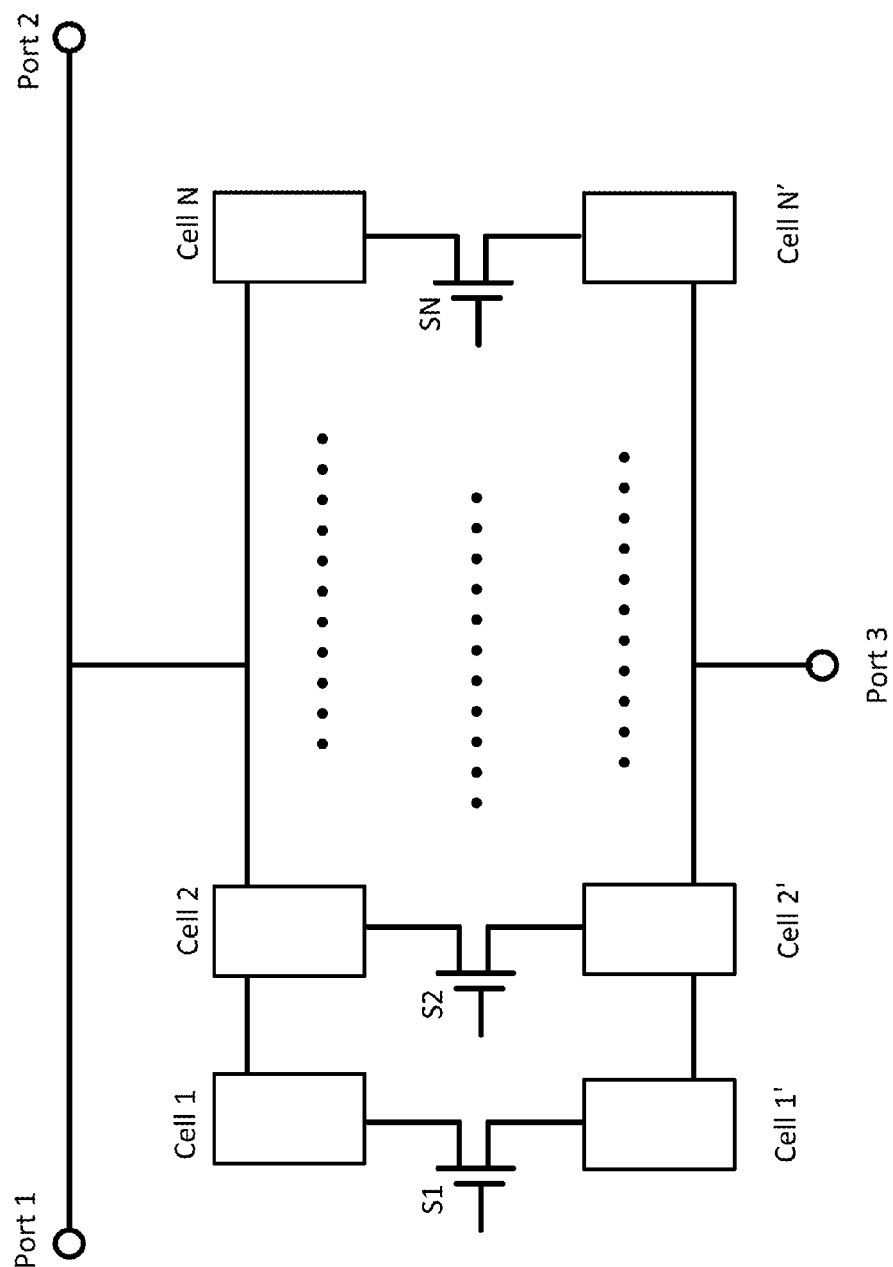

FIG. 4H illustrates yet another example of the tunable matching network 308 according to an embodiment. Similar to the example of FIG. 4F, this configuration includes multiple switches S1, S2 . . . and SN, cell 1, cell 2 . . . and cell N, and cell 1', cell 2' . . . and cell N'. Each switch is coupled to a first cell on one side and a second cell on the other side in series. The branches, each branch having a switch, a first cell on one side of the switch and the second cell on the other side of the switch, are coupled together in parallel. One end of the paralleled branches is coupled to the path coupled to port 1 and port 2; and the other end of the paralleled branches is coupled to port 3. This configuration may provide convenience and ease in designing a shunt circuit by coupling ports 1 and 2 to the RF path 316, with an option of coupling port 3 to another circuit, module or component in the system, shorting it to ground or keeping it open. Each cell may include one or more components such as capacitors and/or inductors. The gate (or base) terminals of the switches S1, S2 . . . and SN are controlled by the controller 320. By turning on one of the switches, this tunable matching network can provide N possible impedance states, which are determined by the combinations of cell 1+cell 1', cell 2+cell 2' . . . and cell N+cell N'. Additional impedance states can be provided by turning on two or more switches.

As in the example of FIG. 4H, where the branches are paralleled to have one common end coupled to the RF path 316 and the other common end being shorted to ground, open or coupled to other parts, similar modifications can be made for the configurations illustrated in FIGS. 4A, 4C, 4D, and 4F. These configurations may provide convenience and ease in designing a shunt circuit by coupling ports 1 and 2 to the RF path 316, whereas the configurations illustrated in FIGS. 4B, 4E and 4G may provide convenience and ease in designing a series circuit by coupling ports 1 and 2 to the RF path 316.

Figure 4I:
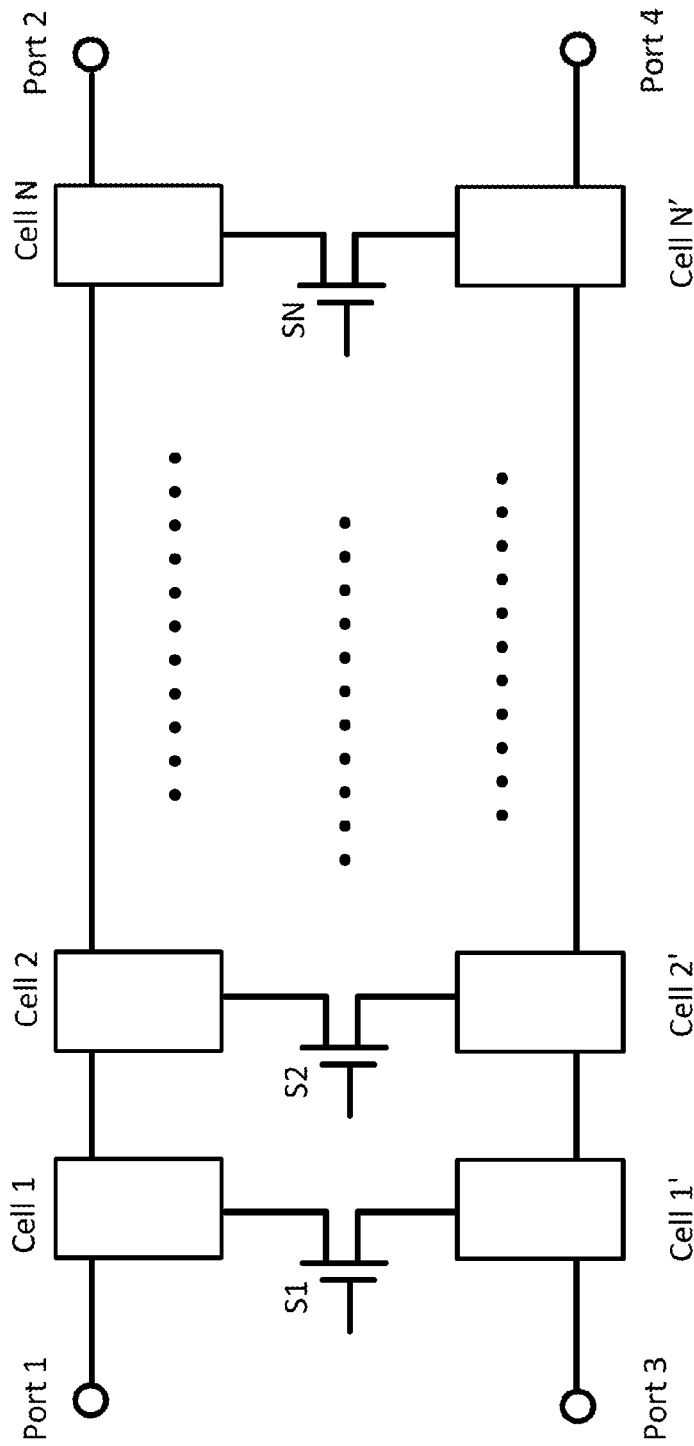

FIG. 4I illustrates yet another example of the tunable matching network 308 according to an embodiment. As in the previous examples, this configuration includes multiple switches S1, S2 . . . and SN, cell 1, cell 2 . . . and cell N, and cell 1', cell 2' . . . and cell N'. Each switch is coupled to a first cell on one side and a second cell on the other side in series. Four ports, port 1, port 2, port 3 and port 4, are provided in this case, allowing for the flexibility of selecting two out of the four ports to be coupled to the RF path 316 with an option of coupling each of the remaining ports to another circuit, module or component in the system, shorting it to ground or keeping it open to achieve multiple functions. Each cell may include one or more components such as capacitors and/or inductors. The gate (or base) terminals of the switches S1, S2 . . . and SN are controlled by the controller 320. By turning on one of the switches, this tunable matching network can provide N possible impedance states, which are determined by the combinations of cell 1+cell 1', cell 2+cell 2' . . . and cell N+cell N'. Additional impedance states can be provided by turning on two or more switches.

Figure 5:
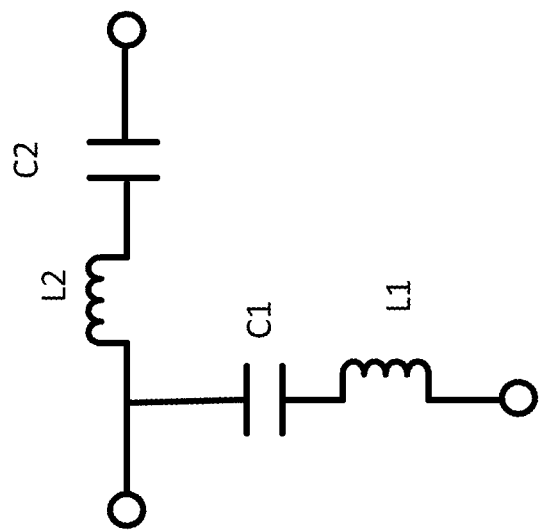
FIG. 5 illustrates an example of a configuration of the components in a cell, where two inductors and two capacitors are provided.

FIG. 5 illustrates an example of a configuration of the components in a cell. Two inductors, L1 and L2, and two capacitors, C1 and C2, are provided. By simply setting the value of a component to be zero, this configuration can represent a cell having only the other non-zero components. In other words, the cell may be configured to have one or more of the components C1, C2, L1 and L2. Additionally, resistors may be added for adjustment and/or modeling purposes. Depending on the configuration that can be selected from FIGS. 4A-4I, C1 and L1 may be coupled in shunt while C2 and L2 may be coupled in series with the RF path 316, or vice versa. The component values, i.e., inductances and/or capacitances, in each cell are selected to have a target impedance value for matching corresponding to the condition and band during the time interval. Depending on the target impedance value, one, two, three or all of the four components may be used. Furthermore, these components values in each cell may be determined so that two or more combinations of the cells can provide additional impedance states. The cells in each branch can be designed and optimized to tune the antenna to the target frequency and impedance to achieve required performances. Therefore, when the switches are in the OFF state, those branches with the OFF switches are configured not to affect the other branches.

The capacitors and inductors can be fabricated based on the same process as the switches, on the CMOS, GaAs, InP or other suitable substrate. They can also be fabricated based on a process different from the one used for the switches. Specifically, at the wafer processing level, the different intrinsic parameters of the switches such as $R_D$, $R_G$ and $R_S$, which are the drain, gate and source resistances, can be designed and optimized using the CMOS, GaAs or InP based fabrication technology. The capacitors and inductors can be included in the same processing technology. Alternatively, the switches can be fabricated first and then in a later process the cells with capacitors can be added. For example, MIM capacitors can be added after the fabrication of the other parts. Similarly, inductors can be added through the use of bonding wires after the semiconductor fabrication. Furthermore, the capacitors and inductors can be discrete especially for large values that are not implementable on a wafer because of the area requirement or for other reasons. The inductors can be implemented by lumped elements, bonding wires, microstrips or combinations.

FIGS. 6A-6D illustrate examples of the tunable matching network 308 using only inductors for the cells according to an embodiment. The inductors can be lumped elements, microstrips on the same substrate as the switches or on a different substrate, bonding wires or combinations of the above. The configuration of FIG. 6A has two ports, port 1 and port 2, which may be coupled to the RF path 316, and one inductor L0 is coupled in shunt to the path between port 1 and port 2. Multiple inductors L1, L2 . . . and LN are coupled in series with multiple switches S1, S2 . . . and SN, respectively. The branches, each branch having an inductor and a switch, are coupled in parallel. One common end of the paralleled branches is coupled to L0. These branches have the other end portions, P1, P2 . . . and PN, individually. Each of P1, P2 . . . and PN can be shorted to ground, coupled to other parts or open. The gate (or base) terminals of the switches S1, S2 . . . and SN are controlled by the controller 320. By turning on one of the switches, this tunable matching network can provide N possible impedance states, corresponding to L0+L1, L0+L2 . . . and L0+LN. Additional impedance states can be provided by turning on two or more switches. L0 can be eliminated depending on the design, or used to model a parasitic.

Figure 6A:
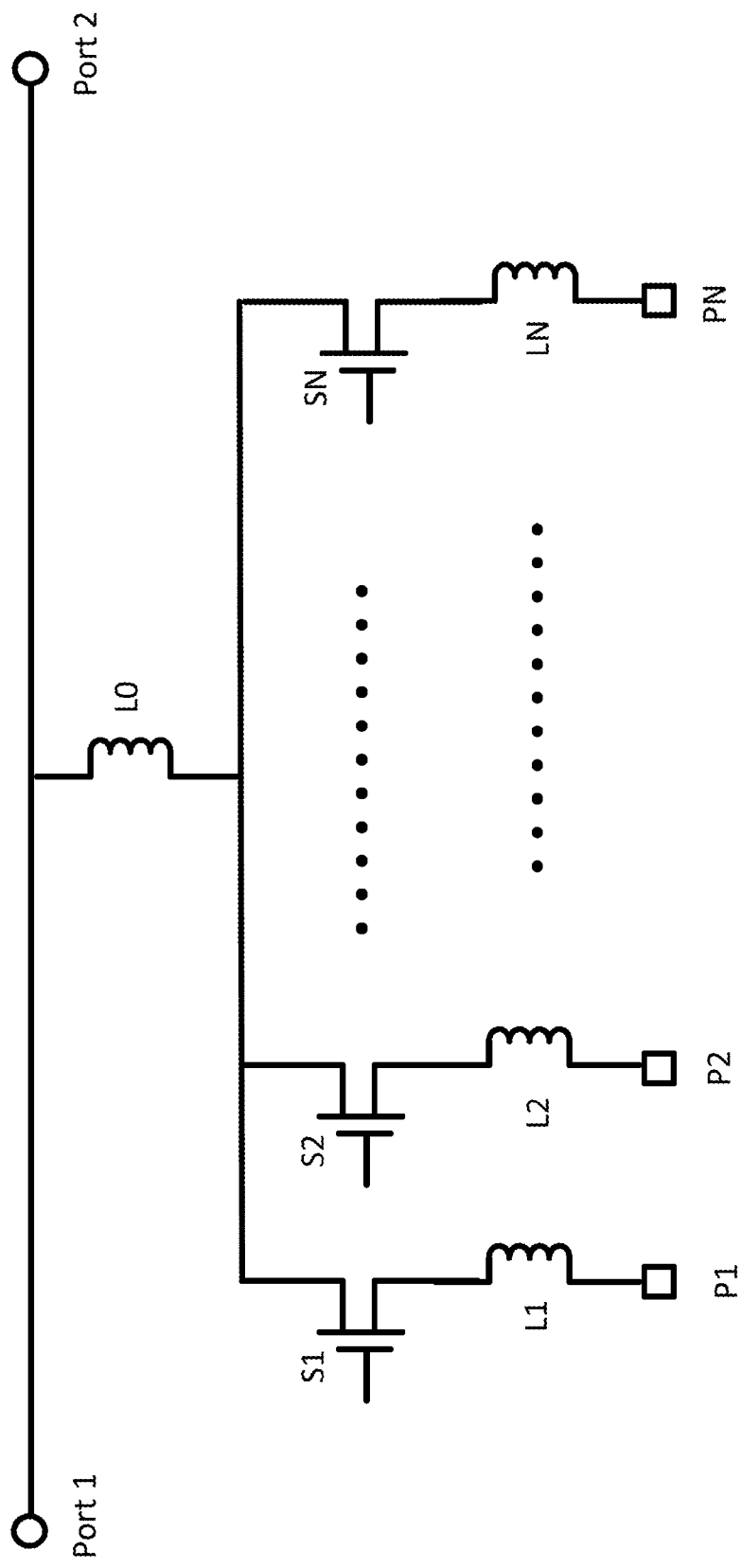
FIGS. 6A-6D illustrate examples of the tunable matching network using only inductors for the cells according to embodiments.
Figure 6B:
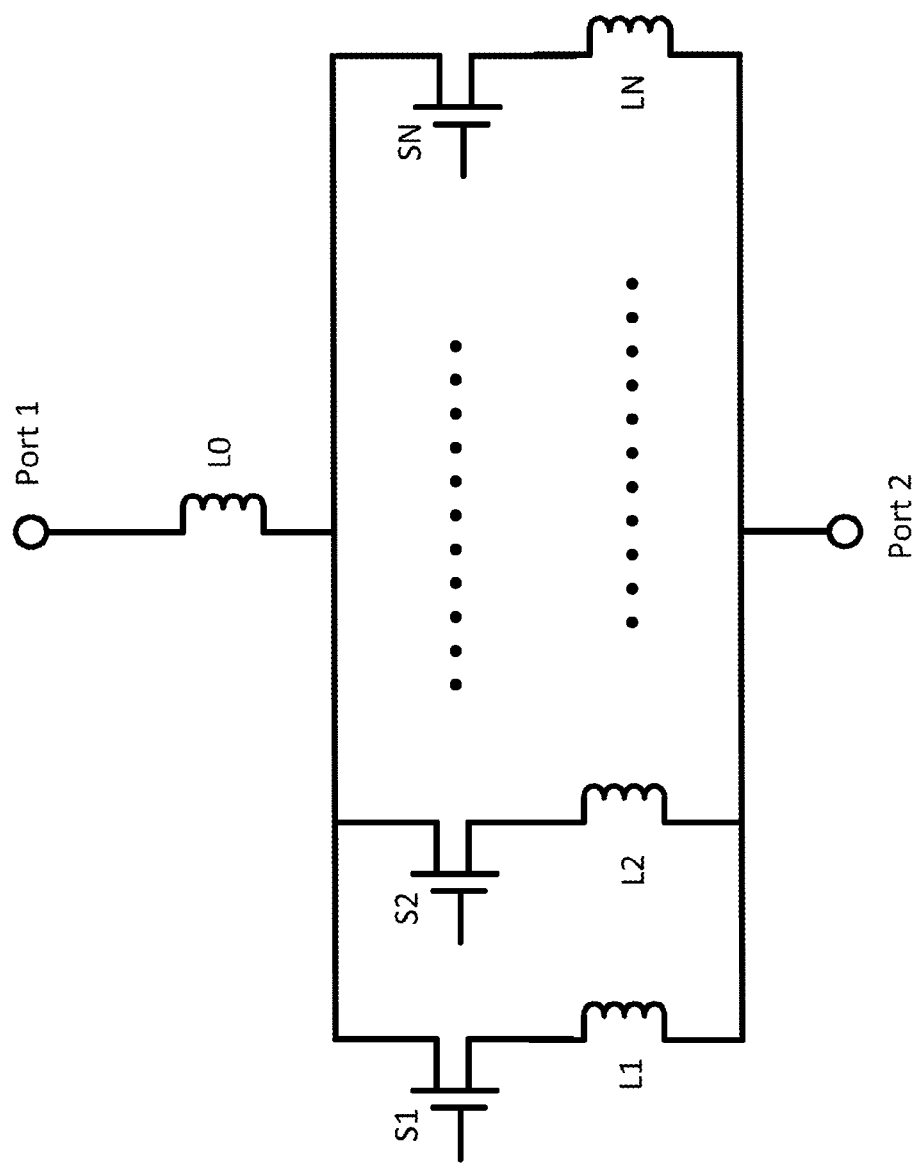

FIG. 6B illustrates another example of the tunable matching network 308 using only inductors for the cells according to an embodiment. As in the example of FIG. 6A, this configuration includes multiple switches S1, S2 . . . and SN coupled to multiple inductors L1, L2 . . . and LN, respectively, in series. Multiple branches, each branch having a switch and a cell, are coupled in parallel. One common end of the paralleled branches is coupled to L0, which is coupled to port 1, and the other common end of the paralleled branches is coupled to port 2. These ports may be coupled to the RF path 316. The gate (or base) terminals of the switches S1, S2 . . . and SN are controlled by the controller 320. By turning on one of the switches, this tunable matching network can provide N possible impedance states, corresponding to L0+L1, L0+L2 . . . and L0+LN. Additional impedance states can be provided by turning on two or more switches. L0 can be eliminated depending on the design, or used to model a parasitic.

Figure 6C:
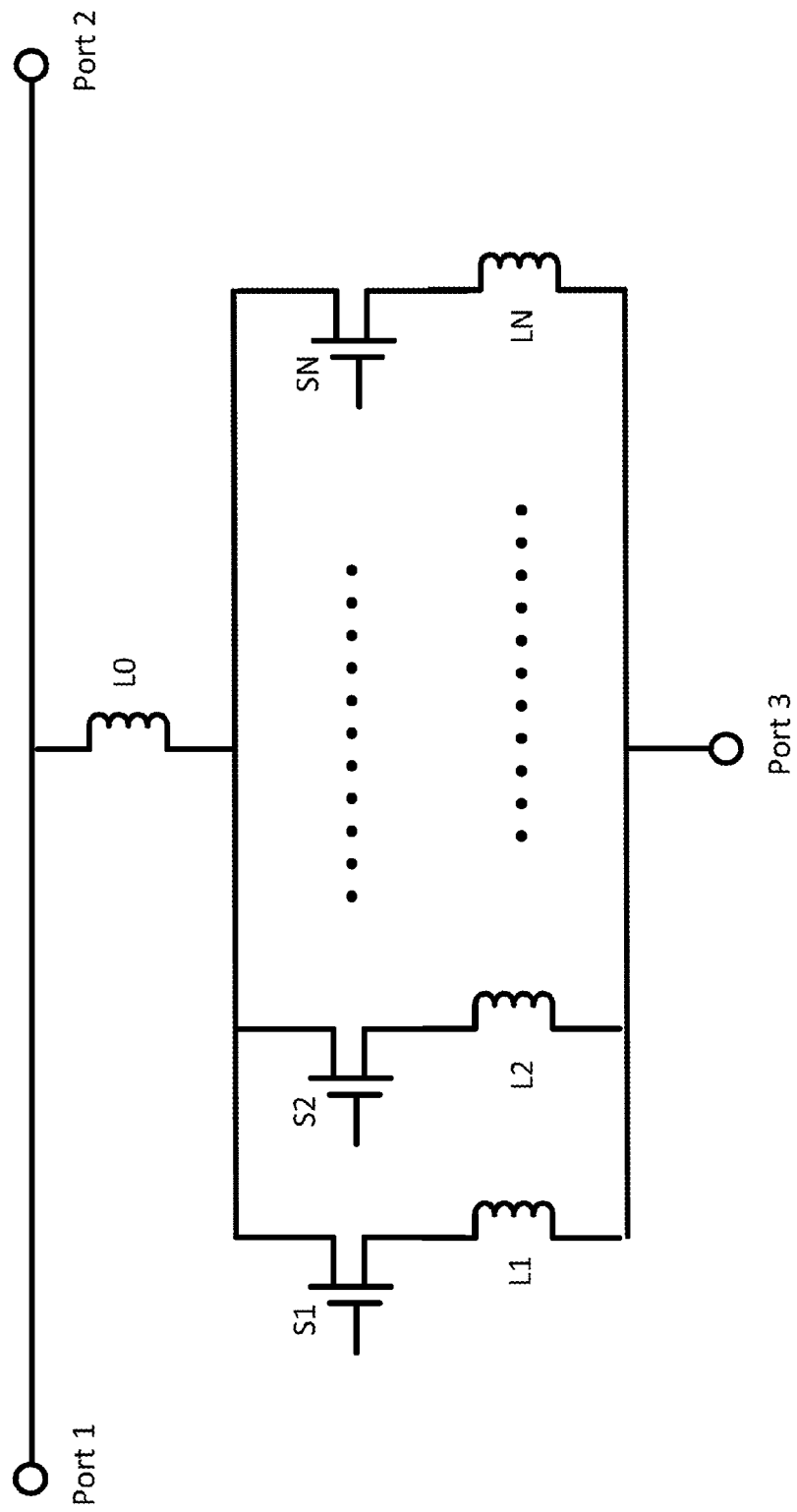

FIG. 6C illustrates yet another example of the tunable matching network 308 using only inductors for the cells according to an embodiment. As in the examples of FIGS. 6A and 6B, this configuration includes multiple switches S1, S2 . . . and SN coupled to cell 1, cell 2 . . . and cell N, respectively, in series. Three ports, port 1, port 2 and port 3, are provided in this case, allowing for the flexibility of selecting two out of the three ports to be coupled to the RF path 316 with an option of coupling the remaining port to another circuit, module or component in the system, shorting it to ground or keeping it open. The gate (or base) terminals of the switches S1, S2 . . . and SN are controlled by the controller 320. By turning on one of the switches, this tunable matching network can provide N possible impedance states, corresponding to L0+L1, L0+L2 . . . and L0+LN. Additional impedance states can be provided by turning on two or more switches. L0 can be eliminated depending on the design, or used to model a parasitic.

Figure 6D:
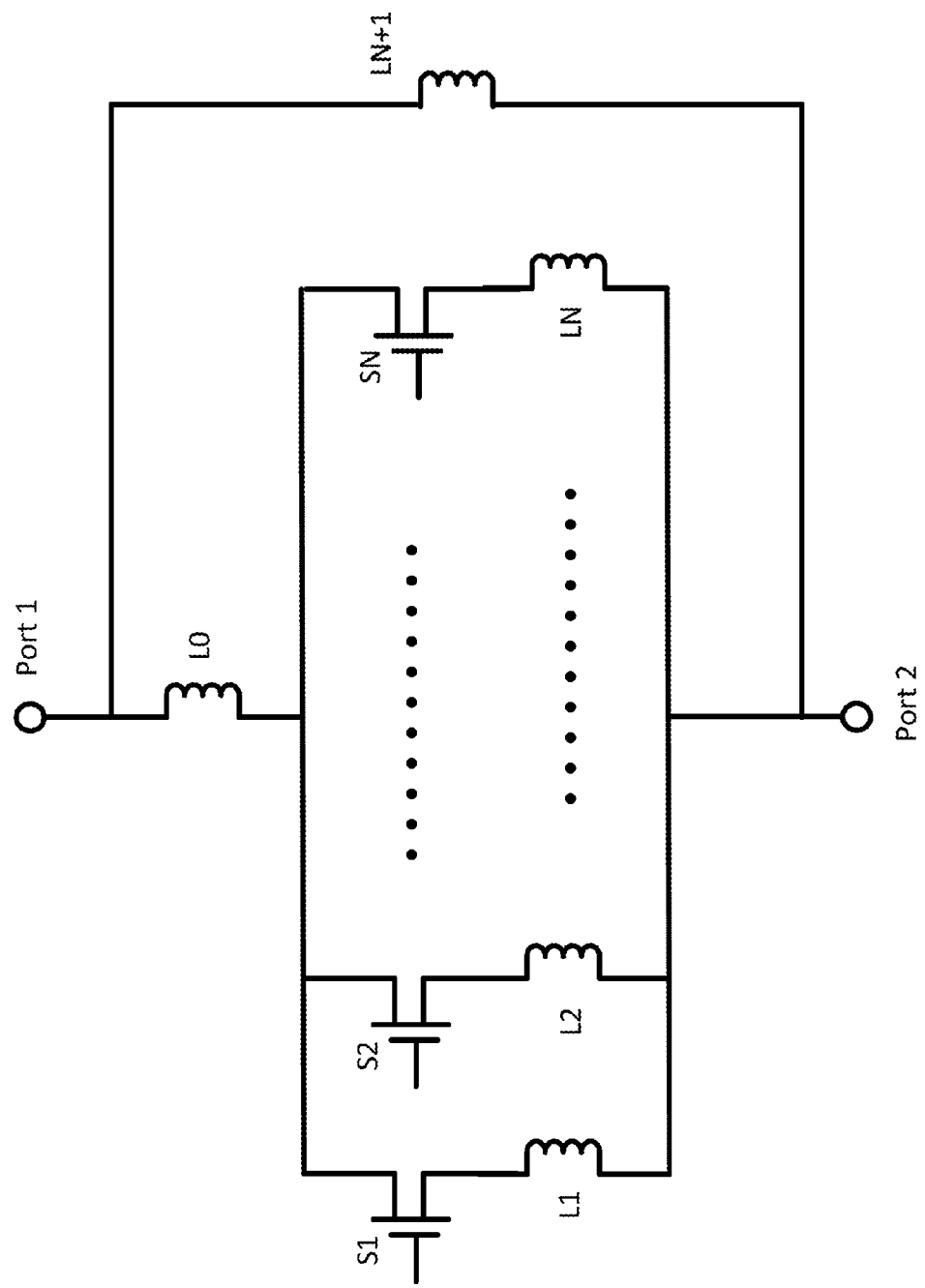

FIG. 6D illustrates yet another example of the tunable matching network 308 using only inductors for the cells according to an embodiment. This configuration includes a path having one inductor, i.e., LN+1, directly coupled to port 1 and port 2 without a switch. This path is additional to a base configuration having switches in respective branches, such as the configurations illustrated in FIGS. 6A-6C. Although the base configuration of FIG. 6B is used in this example of FIG. 6D, any one of or a combination of the base configurations of FIG. 6A-6C can be used. The additional inductor, i.e., LN+1, may be configured to provide an impedance value corresponding to a nominal situation. The inductor LN+1 can be kept ON to handle the nominal situation, and depending on the conditions and perturbations, one or more of the switches in the base configuration can be turned on to adjust the impedance. Thus, this configuration in FIG. 6D leads to reduced power consumption and better efficiency since a switch, which is generally lossy, is unused for the nominal situation.

FIG. 7 illustrates an example of the LUT 324 according to an embodiment. Measured and/or predetermined parameters under various conditions and/or specifications may be stored in the LUT 324 to adjust frequencies, impedances and other properties. For example, the LUT 324 may include characterization data of the antenna 304, such as total radiated power (TRP), total isotropic sensitivity (TIS), specific absorption rate (SAR), radiation patterns and so on, which can be measured in advance for various conditions, e.g., in free space, in the presence of a head, a hand, laps, wood, metal, etc. with different positions and angles. Measured S parameters such as S12 and S11 may also be included. These LUT entries may be updated as needed so that the algorithm can converge faster to an optimum operation. The example in FIG. 7 shows a portion of the LUT 324, where the capacitance and inductance values in a cell are listed according to conditions and bands. For example, condition 1 may refer to the presence of a head with an ear in parallel with the handset; condition 2 may refer to the presence of a metal touching the handset, etc. The device is assumed to operate over four bands 1, 2, 3, and 4 in this table; for example, the frequencies for the Tx of band 1 are 1920-1980 MHz, and the frequencies for the Rx of band 1 are 2110-2170 MHz, the frequencies for the Tx of band 2 are 1850-1910 MHz, and the frequencies for the Rx of band 2 are 1930-1950 MHz, the frequencies for the Tx of band 3 are 1710-1755 MHz, and the frequencies for the Rx of band 3 are 1805-1880 MHz, etc. The capacitance and inductance values may be obtained through measurements of the S parameters, for example, for each band under each condition. The condition during a time interval can be detected by the sensor 328, and the information can be sent to the controller 320, which then refers to the LUT 324 to determine the values of C1, C2, L1 and L2 that can provide the optimum impedance state to recover optimum performances under the condition and for the selected band during the time interval. The predetermined impedance states, as tabulated in the LUT 324, are implemented by the cells. Accordingly, the controller 320 turns on one or more switches coupled to one or more cells that provide the optimum impedance for the band and the condition during the time interval. The present scheme, therefore, eliminates unnecessary impedance states to be prepared, such as those in the excessive capacitance states (e.g. $2^6$) prepared in a binary-weighing scheme. Specifically, the number of possible impedance states afforded by the present tunable matching network 308 is determined to correspond to the number of possible scenarios that the system may encounter, thereby eliminating circuit configurations providing potentially unused impedance states. Furthermore, each impedance state is customized, based on the measured and/or calculated data, for a particular band and a condition, thereby providing tailored impedance matching that conventional binary-weighing schemes do not provide.

Figure 8:
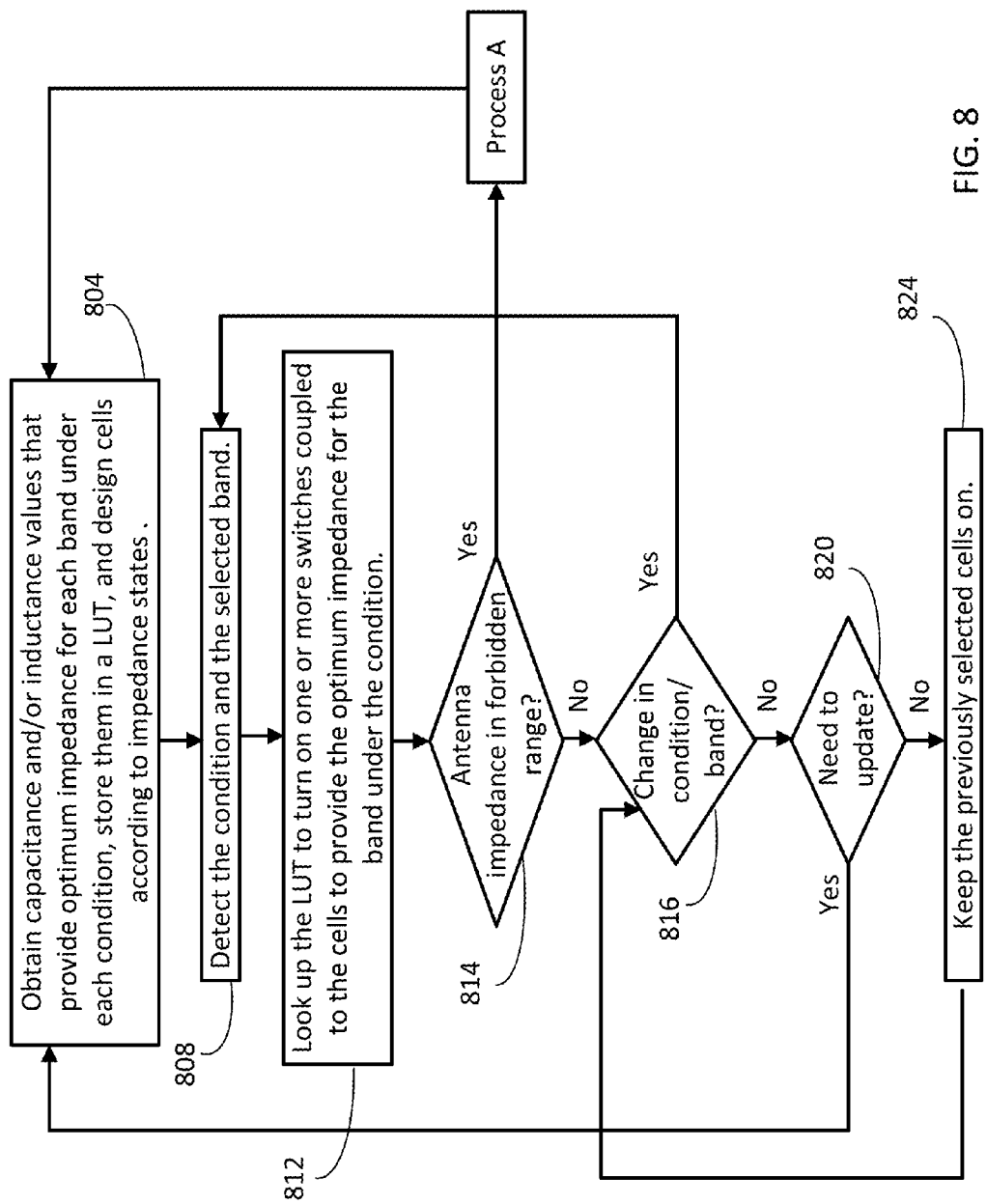
FIG. 8 illustrates a process flow of the impedance matching scheme according to an embodiment.

FIG. 8 illustrates a process flow of the present impedance matching scheme according to an embodiment. First, in step 804, capacitance and/or inductance values that provide optimum impedance are determined through S-parameter measurements, for example, for each band and under each possible condition. The data are stored in the LUT 324 according to the bands and conditions. The tunable matching network 308 is designed to include multiple cells, which are coupled to multiple switches. The cells are designed according to the impedance states. One or more cells can be used to provide needed impedances. In step 808, the condition and the selected band are detected for the time interval. The condition can be detected, for example, by use of one or more sensors 328. In step 812, the controller 320 refers to the LUT 324 to determine the optimum impedance represented by the capacitance and/or inductance values for the band and the condition, and turns on one or more switches coupled to one or more cells to provide the optimum impedance. There are some instances when the antenna impedance is in a range that cannot be matched by choosing any capacitance or inductance values. The LUT 324 does not have entries corresponding to suitable capacitance or inductance values for the forbidden case. In step 814, it is determined if the antenna impedance is in such a forbidden range. If yes, an additional process A is included to provide the resolution for the forbidden case. If no, the process proceeds to step 816, where it is determined if there is a change in condition and/or band. If yes, the process goes back to step 808 to detect the new condition and/or the new band, and follows the steps thereafter. Occasionally, in step 820, it is determined if the LUT entries need to be updated. If yes, the process goes back to step 804 to update the data in the LUT 324. If there is no change, the previously selected one or more cells are kept on to provide the optimum impedance, as in step 824.

Figure 9:
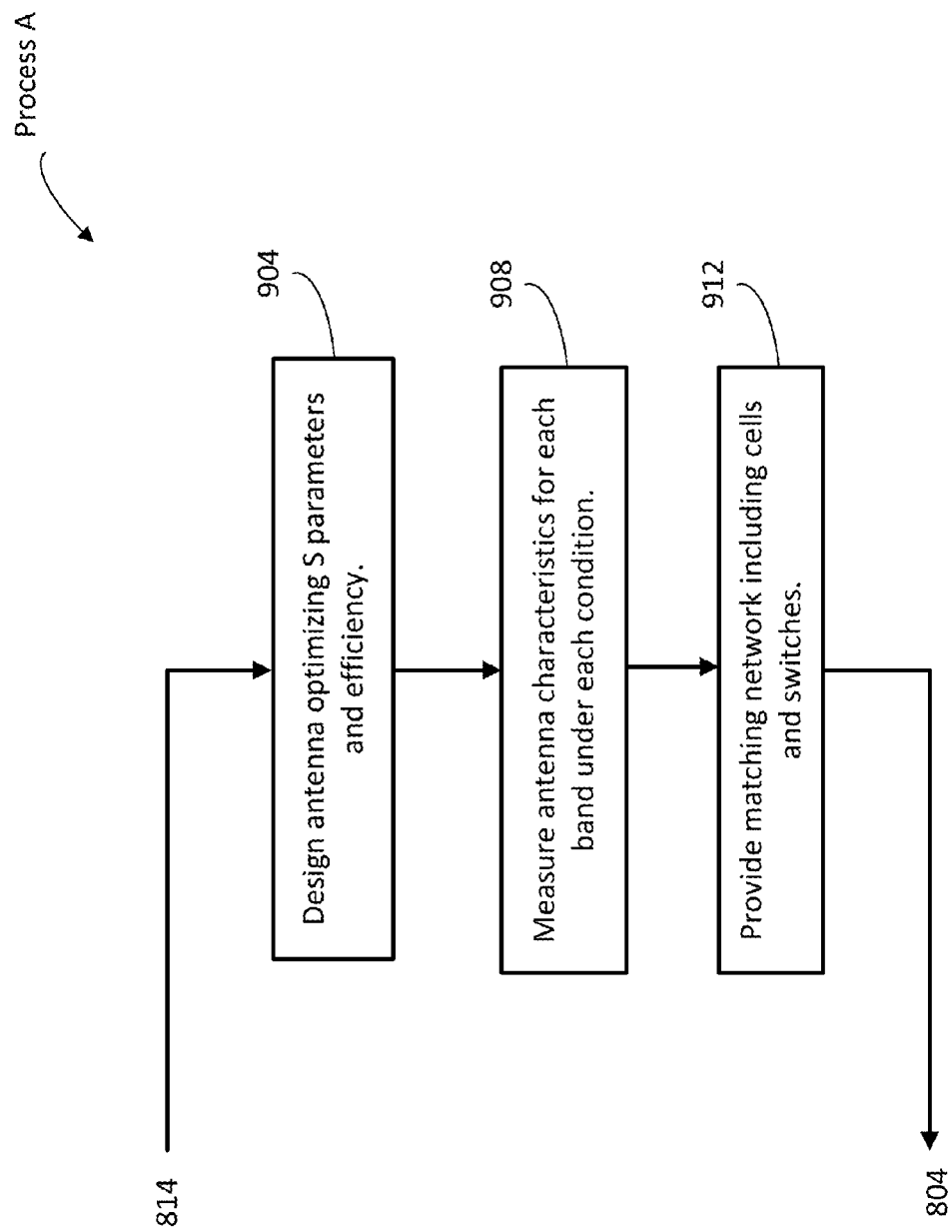
FIG. 9 illustrates the process A.

FIG. 9 illustrates the process A. When the antenna impedance is in a range that cannot be matched by choosing any capacitance or inductance values, the antenna 304 needs to be redesigned for proper matching. In step 904, the antenna 304 is redesigned to optimize S parameters and efficiency. In step 908, characterization data of the antenna, such as TRP, TIS, SAR, and S parameters, are taken, which can be measured in advance for each band and various conditions, e.g., in free space, in the presence of a head, a hand, laps, wood, metal, etc. with different positions and angles. In step 912, the tunable matching network 308 is provided with a suitable configuration of switches and components. The process A then gets back to step 804 of FIG. 8 to obtain capacitance and/or inductance values that provide optimum impedance for each band and condition, based on the measured S parameters, for example. The components such as capacitors and/or inductors are tuned accordingly in each cell of the tunable matching network 308. The capacitance and inductance values are stored in the LUT 324 according to conditions and bands.

When the antenna impedance is in a forbidden range, instead of redesigning the antenna 304, it may be possible to achieve proper impedance matching by changing the configuration of the tunable matching network 308, such as those illustrated in FIGS. 4A, 4B and 4C, and FIGS. 6A, 6B and 6C. For example, the original configuration of FIG. 4A may be changed to FIG. 4B, wherein the shunt components and the series components are interchanged. In another example, one of the all-inductor configurations, such those illustrated in FIGS. 6A, 6B and 6C, may be utilized.

In the following, examples of implementation of the tunable matching network are described. As shown in FIGS. 4A-6D, a variety of configurations and component selections can be made for constructing the tunable matching network according to the present scheme, which provides impedance values tailored for individual bands and conditions to achieve optimum system performances.

FIG. 10 is a table showing four topologies with respective output power values (in dBm). In this table, examples of measured output power values are listed separately for the first harmonics (1f0), the second harmonics (2f0) and the third harmonics (3f0) under each topology. Each topology may represent a branch of the tunable matching network, the branch having a switch and a total capacitance value of 0.133 pF. Topology A has one capacitor of 0.133 pF on one side of the switch and none on the other side; Topology B has one capacitor of 0.266 pF on one side of the switch and one capacitor of 0.266 pF on the other side; Topology C has two capacitors of 0.266 pF on one side of the switch and none on the other side; and Topology D has two capacitors of 0.532 pF on one side of the switch and one capacitor of 0.266 pF on the other side. It can be seen that the effects arising from the second and third harmonics are reduced significantly in Topologies B, C and D as compared to Topology A. Thus, this measurement suggests that when a branch in the tunable matching network has multiple capacitors, improvement in performance can be expected due to the reduction of the second and higher harmonics. It is considered that the reduction is due to the additional inductance generated by a path between capacitors, the increased capacitor size as each capacitance value needs to be increased to provide multiple capacitors that are equivalent to one capacitor, and other features caused by the increase of the number of capacitors. Additionally, capacitors large in area, and hence capacitance, are generally robust to ESD. Thus, it is beneficial to use multiple large capacitors in series to prevent ESD damages, instead of using one small capacitor that is sensitive to ESD. Furthermore, a symmetric configuration, i.e., a branch having a first cell on one side of the switch and a second cell on the other side of the switch, provides flexibility in designing the system since the configuration can be used in series or in shunt, and connection ports such as RF+ and RF− can be interchanged without causing problems. In the symmetric cases, reciprocal properties in the S parameters, i.e., S11=S22 and/or S12=S21, can be obtained by a quick adjustment to enhance features and performances of the system.

Based on the above observations, the present implementation examples consider the configurations, in which in each branch one cell is coupled to the switch on one side and the other cell is coupled to the switch on the other side, as illustrated in FIGS. 4D, 4E, 4F, 4G and 4I, and each cell is configured to include one or more capacitors to reduce the $2^{nd}$ and higher harmonics effects.

Figure 11:
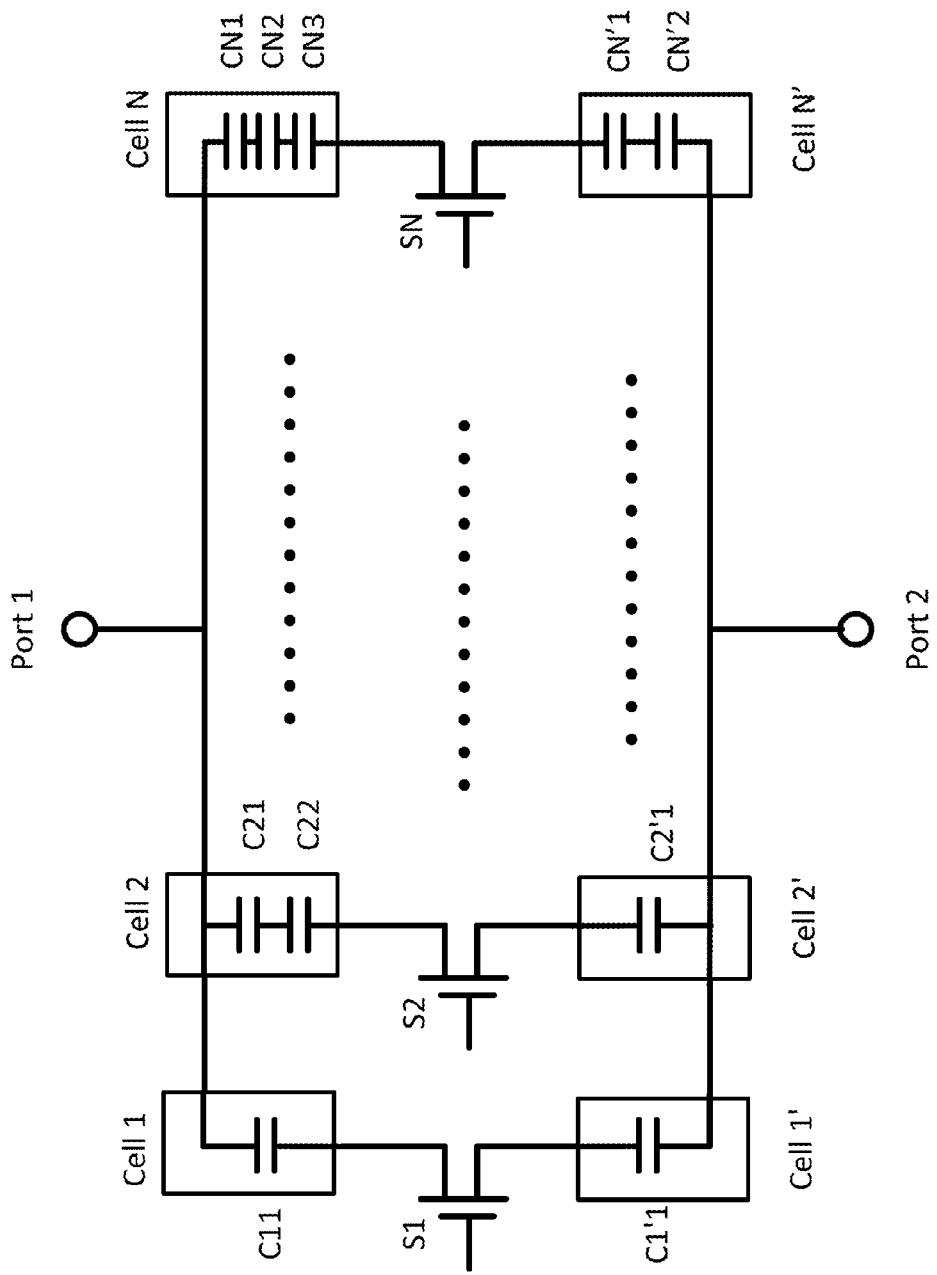
FIG. 11 illustrates an implementation example based on the configuration of FIG. 4E, where each branch has a first cell on one side of the switch and a second cell on the other side of the switch, and each cell has one or more capacitors.
Figure 12:
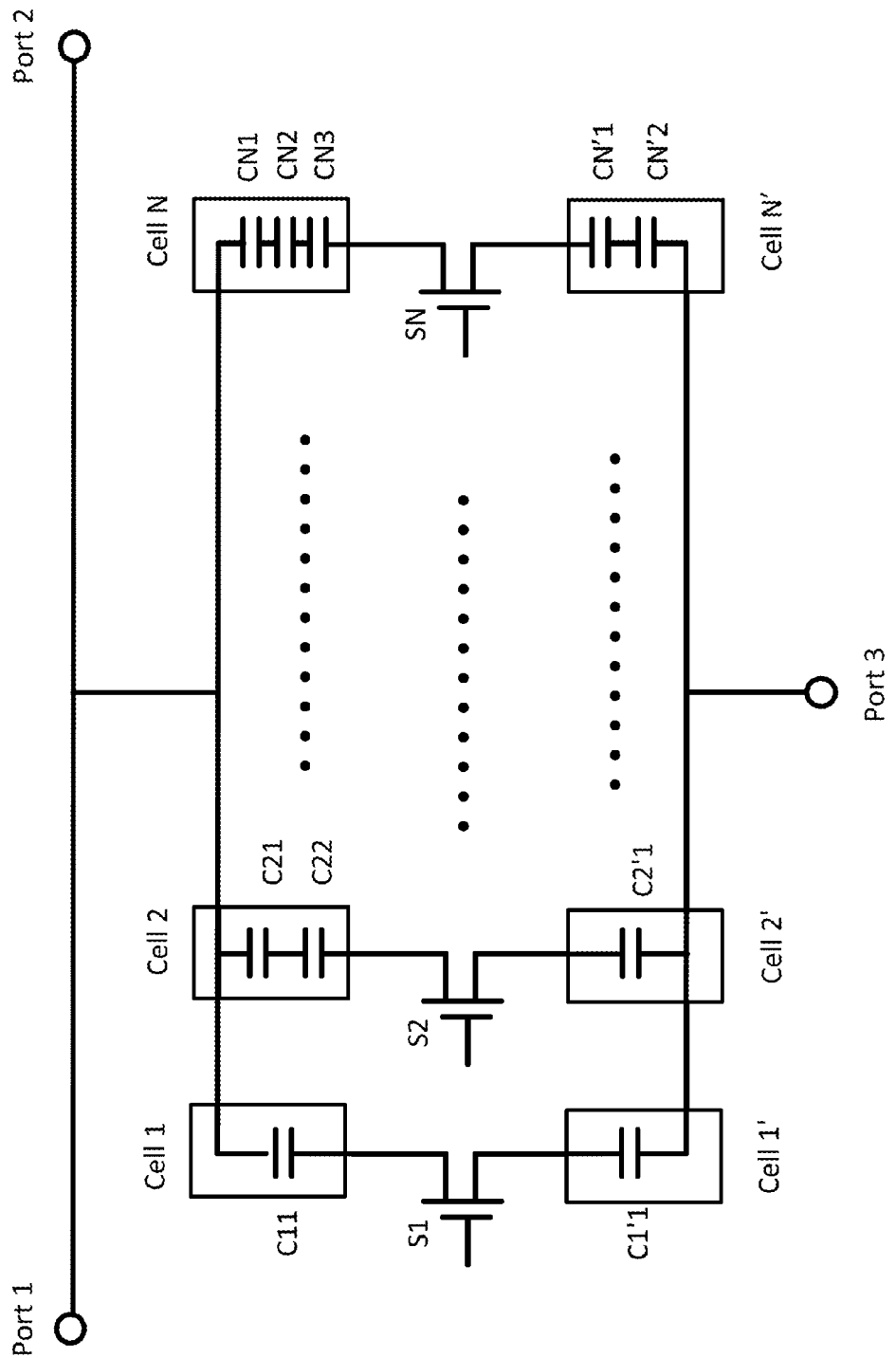
FIG. 12 illustrates another implementation example based on the configuration of FIG. 4H, where each branch has a first cell on one side of the switch and a second cell on the other side of the switch, and each cell has one or more capacitors.

Specifically, FIG. 11 illustrates an implementation example based on the configuration of FIG. 4E, where each branch has a first cell on one side of the switch and a second cell on the other side of the switch, and each cell has one or more capacitors. This configuration may be used in series with the RF path by coupling port 1 to an RF+ port and port 2 to an RF− port, or vice versa. Additionally, FIG. 12 illustrates another implementation example based on the configuration of FIG. 4H, where each branch has a first cell on one side of the switch and a second cell on the other side of the switch, and each cell has one or more capacitors. This configuration may be used in shunt with the RF path by coupling port 1 to an RF+ port and port 2 to an RF− port, or vice versa, and shorting port 3 to ground, coupling it to other parts of the system, or keeping it open. In the examples of FIGS. 11 and 12, Cell 1 has one capacitor C11 and Cell 1' on the other side of the switch S1 has one capacitor C1'1, Cell 2 has two capacitors C21 and C22 and Cell 2' on the other side of the switch S2 has one capacitor C2'1, . . . and Cell N has three capacitors CN1, CN2 and CN3 and Cell N' on the other side of the switch SN has two capacitors CN'1 and CN' 2. The number of capacitors as well as the total capacitance value per cell can be chosen depending on the impedance states to be provided for optimization for different frequency bands, use conditions, etc. and the target amount of higher harmonics reduction. Although only capacitors are used in the cells in the above examples for illustrative purpose, inductors can be added in the cells, or more complex cells such as shown in FIG. 5 can be used.

Figure 13:
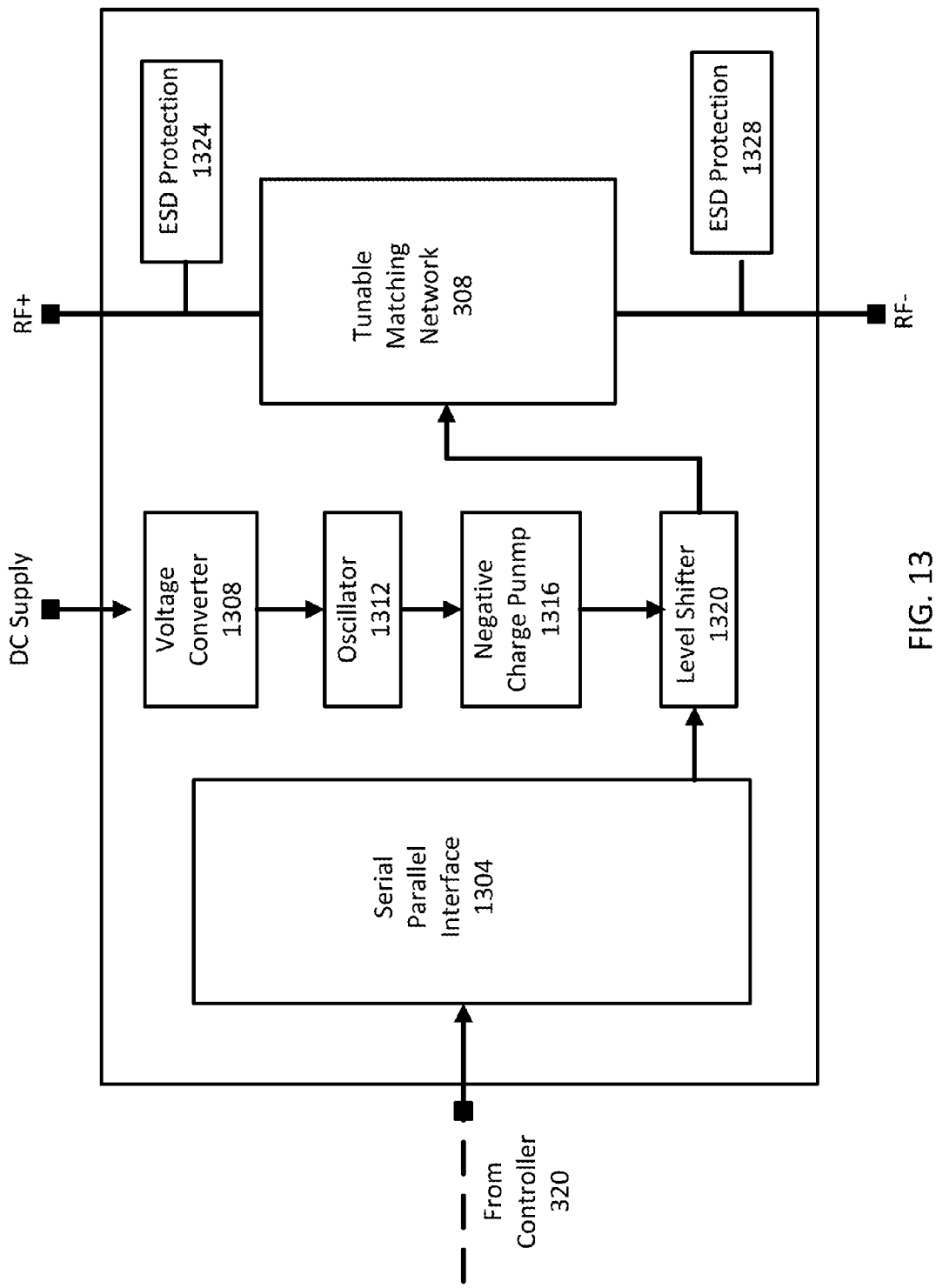
FIG. 13 is a block diagram illustrating an example of an integration of the tunable matching network 308 and its peripherals.

FIG. 13 is a block diagram illustrating an example of an integration of the tunable matching network 308 and its peripherals. The tunable matching network 308 uses MOS switches in this example, and is coupled with the RF path through terminals labeled RF+ and RF−. The control signals from the controller 320 are inputted to a serial parallel interface 1304. The serial parallel interface 1304 can be configured per specifications of the Mobile Industry Processor Interface (MIPI) Alliance, General Purpose Input/Output (GPIO), Serial Parallel Interface (SPI), or Inter-Integrated Circuit ($I^2C$), to realize bidirectional control, for example. A voltage converter 1308 receives DC voltage from an external DC voltage supply and converts it to a certain level, and the DC signal is sent to an oscillator 1312. The oscillator 1312 generates a repetitive signal with a certain frequency. A negative charge pump 1316 receives the repetitive signal from the oscillator 1312, and further performs the DC to DC conversion. A level shifter 1320 receives the control signal from the controller 320 through the serial parallel interface 1304 as well as the DC signal from the negative charge pump 1316. Based on the processed signals, the level shifter 1320 supplies the gate voltages to the MOS switches used in the tunable matching network 308 for ON/OFF control of each switch. ESD protection circuits 1324 and 1328 are provided on both sides of the tunable matching network 308 in this example.

Figure 14:
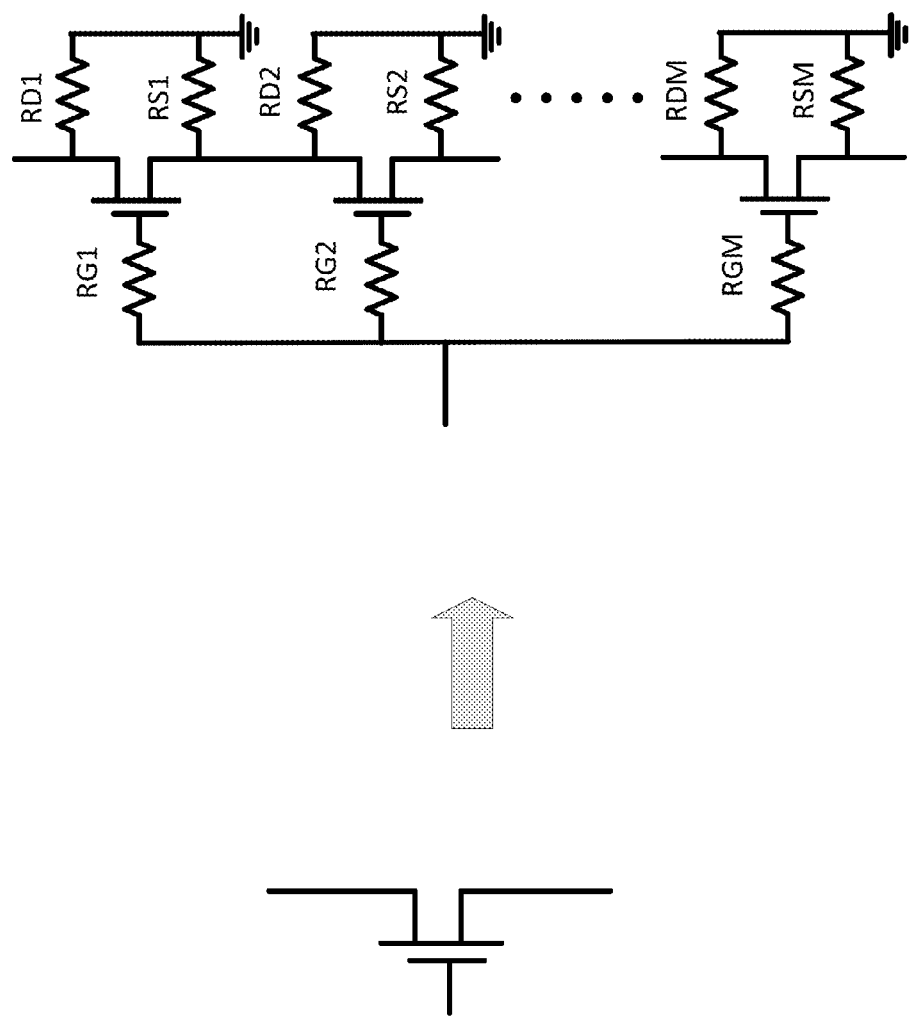
FIG. 14 illustrates an example of a stacked n-MOS switch using the intrinsic parameters, $R_D$, $R_G$ and $R_S$.

A stacked n-MOS switch may be used in the implementation in order to handle different power levels up to a high power level, e.g., 35 dBm. FIG. 14 illustrates an example of a stacked n-MOS switch using the intrinsic parameters, $R_D$, $R_G$ and $R_S$, which are the drain, gate and source resistances. These parameters can be optimized using the MOS fabrication technology at the wafer processing level. The length of the switch may be fixed, and the width may be optimized under the trade-off among the insertion loss (hence the quality factor), high power handling capability and die area.

Figure 15:
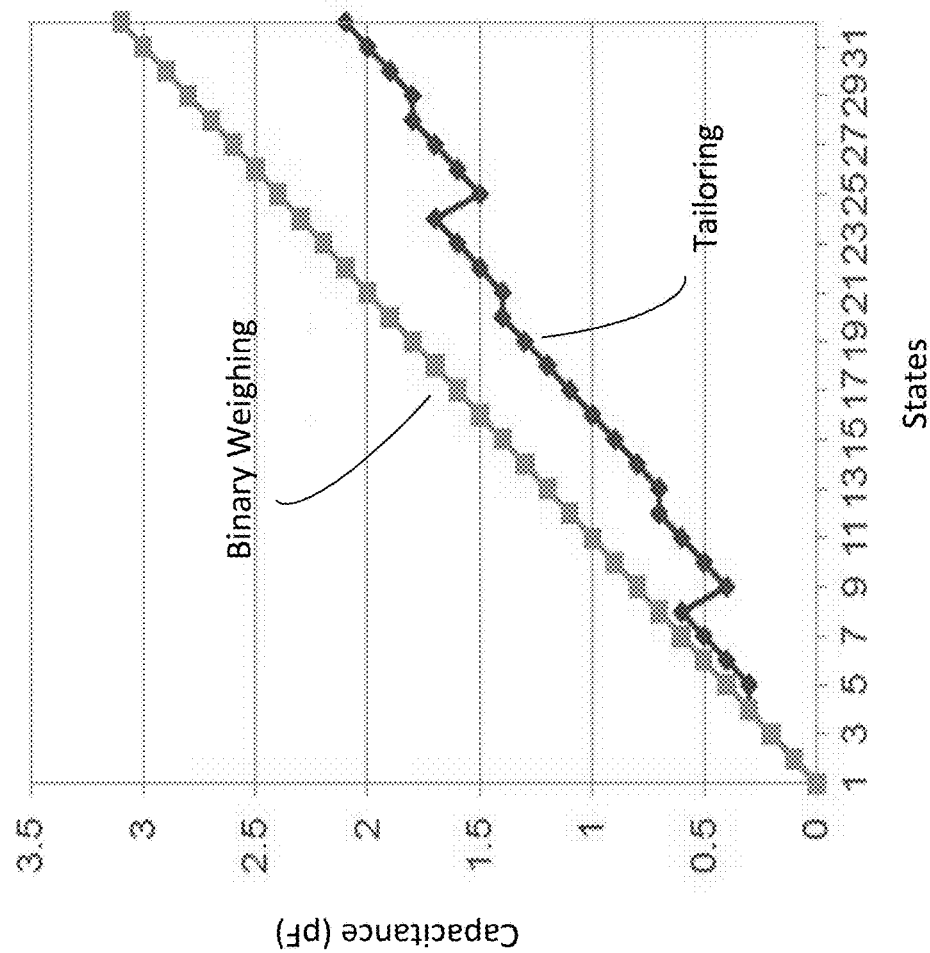
FIG. 15 is a plot illustrating the difference between the binary-weighing scheme and the present tailoring scheme based on an example of using only capacitors and switches for the impedance matching.

As mentioned earlier, the present matching scheme provides matching network configurations having impedance values tailored for individual scenarios depending on frequency bands, conditions, environments and so on. This scheme is fundamentally different from a conventional scheme of providing beforehand impedance values corresponding to discrete points in the Smith chart based on combinations of fixed capacitance values, which may be unnecessarily excessive, wasting real estate, and/or missing optimum impedance values. Specifically, in the conventional fixed-capacitance scheme, termed a binary scheme herein, the capacitors and switches are binary-weighted from a least significant bit (LSB) to a most significant bit (MSB). On the other hand, in the present tailored scheme, impedance values are optimized in advance according to frequency bands and detectable conditions including use conditions and environments. FIG. 15 is a plot illustrating the difference between the binary-weighing scheme and the present tailoring scheme based on an example of using only capacitors and switches for the impedance matching. The binary scheme covers a wide range of capacitance values with equidistant discrete steps, from the LSB to the MSB, giving a linear behavior as the impedance state varies. On the other hand, the present tailoring scheme covers a narrower range of capacitance values, avoiding unnecessarily excessive coverage at the low-end capacitance values and the high-end capacitance values. The non-linear behavior is due to the impedance values and states tailored for various conditions, environments and others. As an example, suppose the tunable matching network having three branches in parallel is used, where the first branch has a capacitance of 0.15 pF, the second branch has a capacitance of 0.4 pF and the third branch has a capacitance of 0.5 pF. The state 1 may correspond to turning on the switch in the first branch, providing 0.15 pF. The state 2 may correspond to turning on the switches in the first and second branches, providing a capacitance of 0.55 pF. The state 3 may correspond to turning on the switches in the first, second and third branches, providing 1.05 pF. Therefore, the present tailoring scheme shows a non-linear behavior in the capacitance-versus-state figure.

Although the non-linear behavior in the capacitance-versus-state figure does not itself pose any technical problems, a predictable linear behavior may be desired in some cases. The present scheme can be configured to provide the linear behavior by taking into account package parasitic effects as described below. Here, impedance based on capacitance and inductance is considered to obtain the linear behavior in the impedance-versus-state figure.

Figure 16:
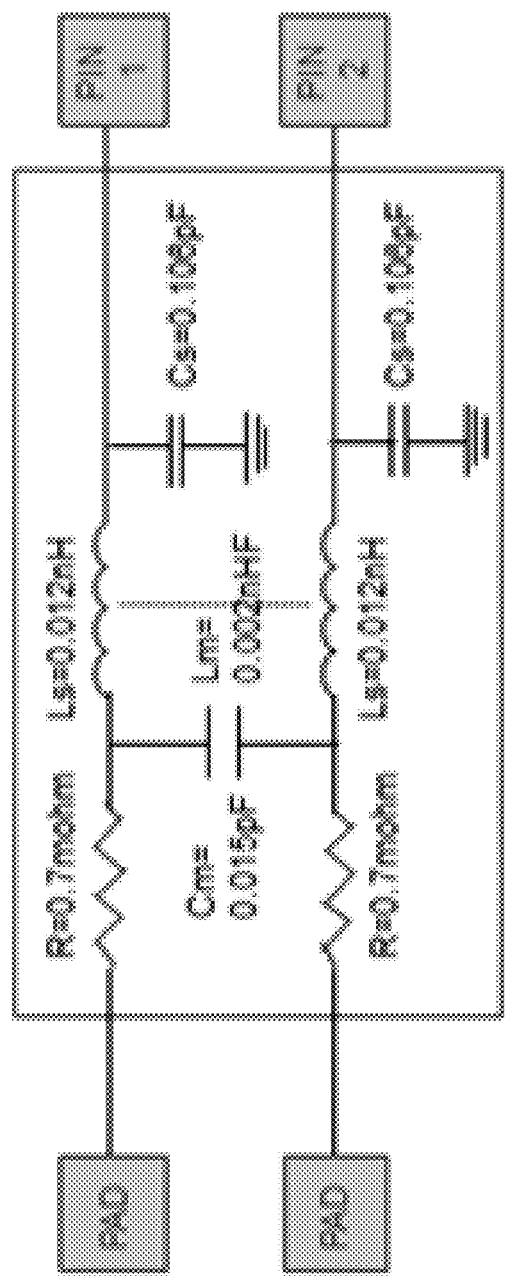
FIG. 16 is an example of an equivalent circuit modeling the parasitic effects of a Quad Flat No-lead (QFN) package.

Package parasitics are generally explained in a datasheet in terms of an equivalent circuit. For example, some packages utilize solder bumps for attaching a flip chip and/or wire bonding for connections. The effects arising from such bumps, wire bonds, pads, pins, etc. are parameterized and determined by the manufacturer. FIG. 16 is an example of an equivalent circuit modeling the parasitic effects of a Quad Flat No-lead (QFN) package. This package provides two pins and two pads, and the parasitics are modeled using the resistance R, series inductance Ls, mutual inductance Lm, mutual capacitance Cm, and shunt capacitance Cs.

Figure 17:
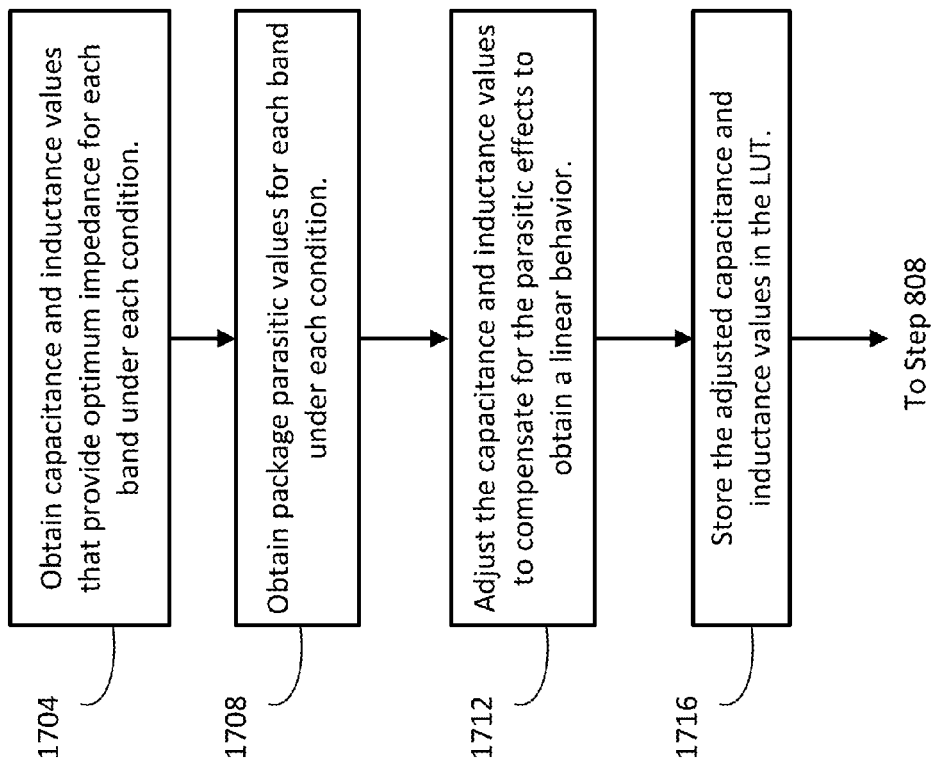
FIG. 17 is a flow chart illustrating the process of obtaining the linear behavior using the package parasitics.

FIG. 17 is a flow chart illustrating the process of obtaining the linear behavior using the package parasitics. This process essentially replaces the step 804 in FIG. 8, where the impedance matching scheme is illustrated according to the embodiment. In step 1704, capacitance and inductance values are obtained to provide optimum impedance for each band under each condition. The tuning range covered by the obtained impedance states is thus determined in this procedure. In step 1708, package parasitic values, such as parasitic capacitances and parasitic inductances, are obtained for each band under each condition. In step 1712, the capacitance and inductance values corresponding to the respective impedance states are adjusted to compensate for the parasitic effects. The compensation is done to minimize the deviation from the linear behavior at each impedance state, thereby obtaining the linear behavior in the impedance-versus-state figure. In step 1716, the adjusted capacitance and inductance values are stored in the LUT, and the process proceeds to the step 808 of FIG. 8.

Figure 18:
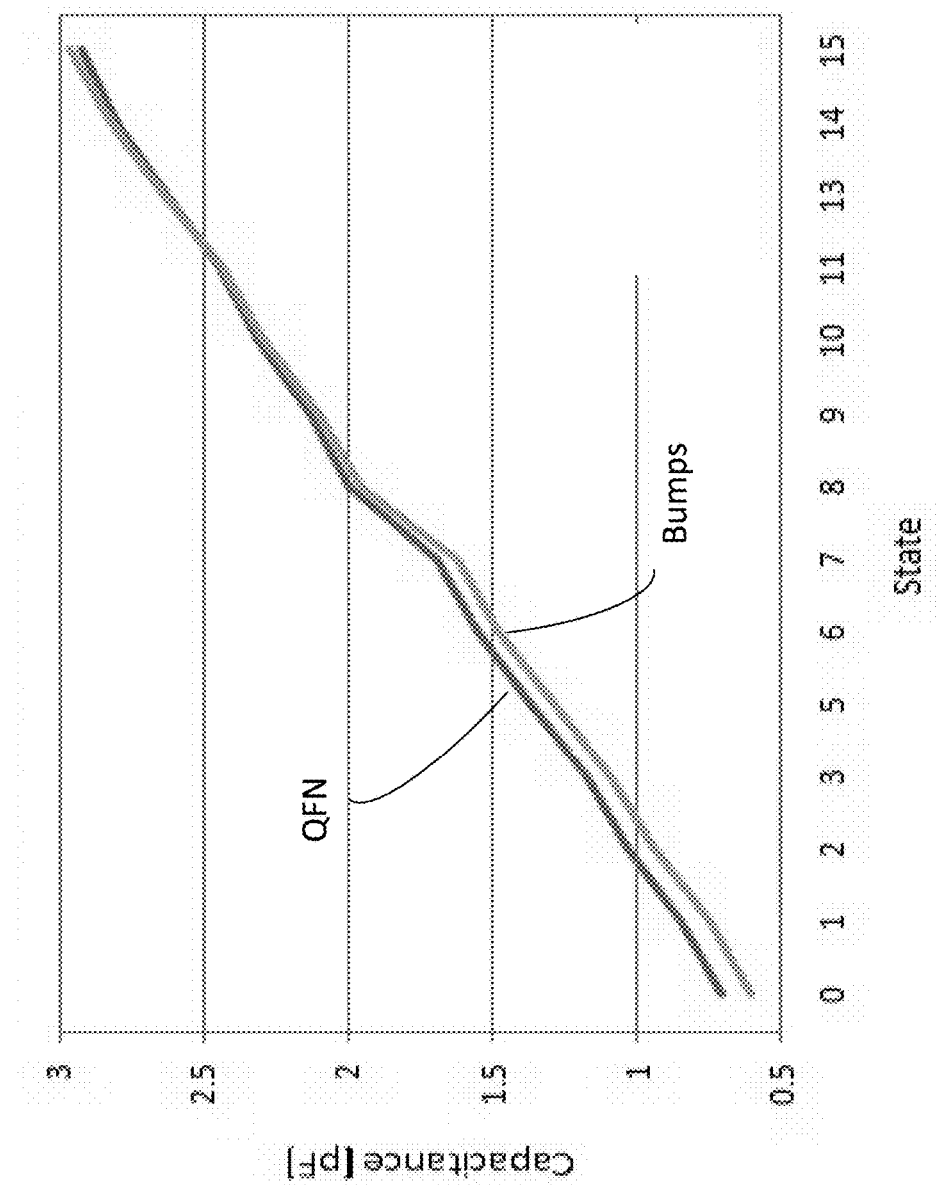
FIG. 18 is a plot showing an example of a simulation result obtained by including the parasitic effects for the cases of using a QFN package and a package containing bumps.

FIG. 18 is a plot showing an example of a simulation result obtained by including the parasitic effects for the cases of using a QFN package and a package containing bumps. Relatively smooth, linear behavior is obtained in the capacitance-versus-state figure for the both cases.

There are instances where impedance matching needs to be carried out for two or more frequency bands simultaneously. For example, simultaneous transmission or reception of data and voice may require retuning of the system to optimize the signal transmission or reception in two bands simultaneously. A multiband phase shifter can be used to turn phases, hence impedances, for multiple frequency bands. Examples of such multiband phase shifters include a circuit with active loss compensation based on the RF CMOS technology by Lu et al., IEEE Transactions on Microwave Theory and Techniques, Vol. 54, No. 1, January 2006. In this circuit topology, an active component such as a distributed power amplifier is used with varactor-tuned LC networks to provide wide phase-turning ranges for multiple bands. In the following, a phase shifter based on a composite right and left handed (CRLH) structure is considered to provide multiband impedance matching. Such a phase shifter can be added to the tunable matching network to adjust the impedance states provided by the cells and switches by turning the phases corresponding to two or more frequency bands simultaneously.

The phase-versus-frequency relationship differ significantly in a right handed (RH) material, a left handed (LH) material and a composite right and left handed (CRLH) material. RH materials are naturally occurring materials such as microstrips, whereas LH materials and CRLH materials are called metamaterials that are artificially structured. The propagation of electromagnetic waves in RH materials obeys the right-hand rule for the (E, H, $\beta$) vector fields, where E is the electric field, B is the magnetic field and $\beta$ is the wave vector (or propagation constant). LH materials have a negative index of reflection with simultaneously negative permittivity and permeability, with the (E, H, $\beta$) following the left-hand rule. See, for example, Caloz and Itoh, "Electromagnetic Metamaterials: Transmission Line Theory and Microwave Applications," John Wiley & Sons (2006). See also, for example, "Class-F Power Amplifier Using a Multi-Frequency Composite Right/Left-Handed Transmission Line Harmonic Tuner," by A. Dupuy et al., Microwave Symposium Digest, 2005 IEEE MTT-S International, June 2005, pp. 2023-2016, for the description of circuit designs based on the impedance transformation, the phase-versus-frequency relationship and other features associated with CRLH structures.

Figure 19:
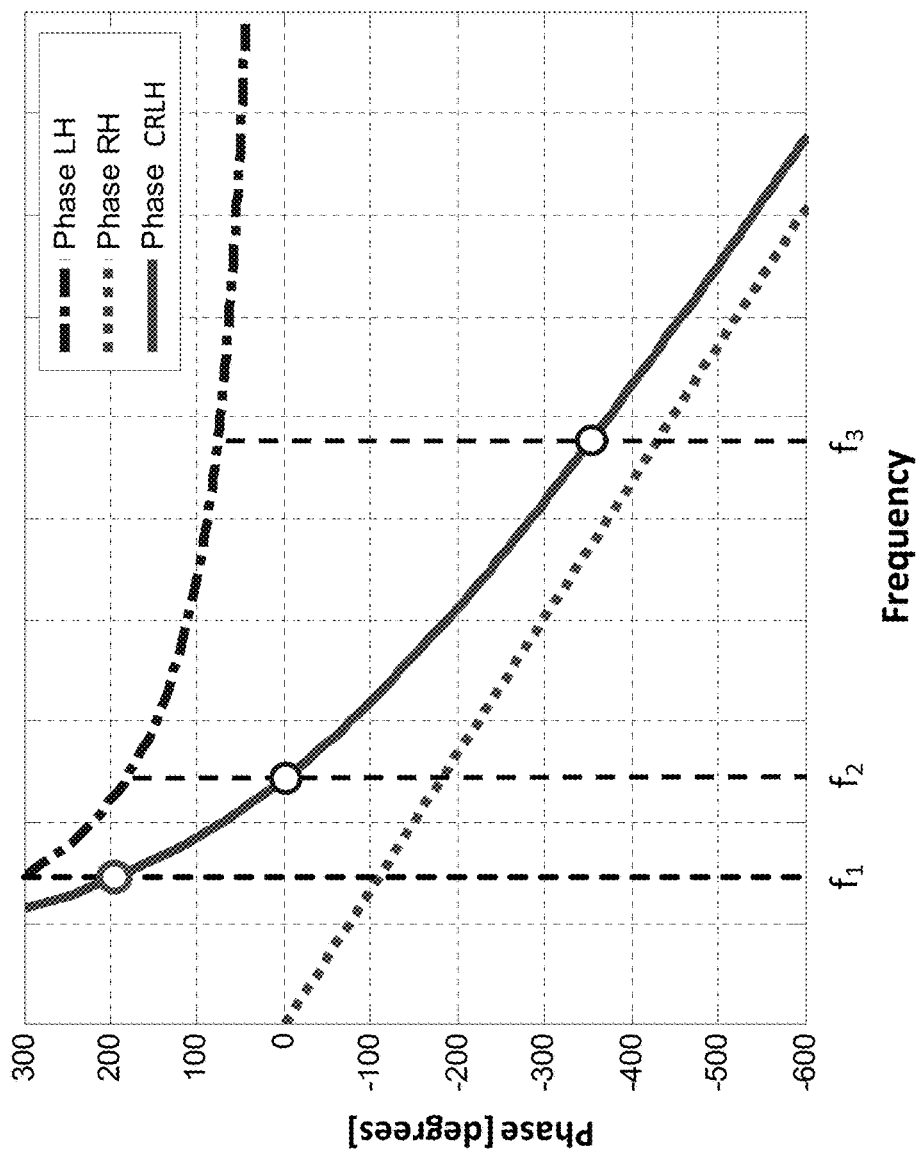
FIG. 19 is a plot showing examples of phase-versus-frequency curves for an RH structure (dotted line), an LH structure (dotted-dashed line) and a CRLH structure (solid line).

FIG. 19 is a plot showing examples of phase-versus-frequency curves for an RH structure (dotted line), an LH structure (dotted-dashed line) and a CRLH structure (solid line). The RH phase is linear in frequency and can take on only negative values, whereas the LH phase can take on only positive values. Thus, the choice of a frequency-phase pair is limited for the RH or LH structure. On the other hand, the CRLH phase is non-linear in frequency, and the phase spans to reach large values in both the positive and negative directions. The curvature of the CRLH is non-linear and can be adjusted by designing the CRLH structure accordingly.

Thus, two or more desired frequency-phase pairs can be selected from the same CRLH curve. As an example, indicated in FIG. 19 are three different frequencies $f_1$, $f_2$ and $f_3$ corresponding to three different phases. The target pairs of frequency and phase can be obtained by designing the CRLH structure to exhibit the desired phase-versus-frequency curve. In general, impedance Z and phase $\Phi$ are related by the following relationship:

$$Z=\text{Real}(Z)+j\text{Imaginary}(Z)=\exp(j\Phi). \quad \text{Eq. (1)}$$

Therefore, the non-linear phase-versus-frequency characteristics of the CRLH structure can provide flexibility for obtaining the optimum impedance values for specified multiple frequency bands, respectively.

Figure 20:
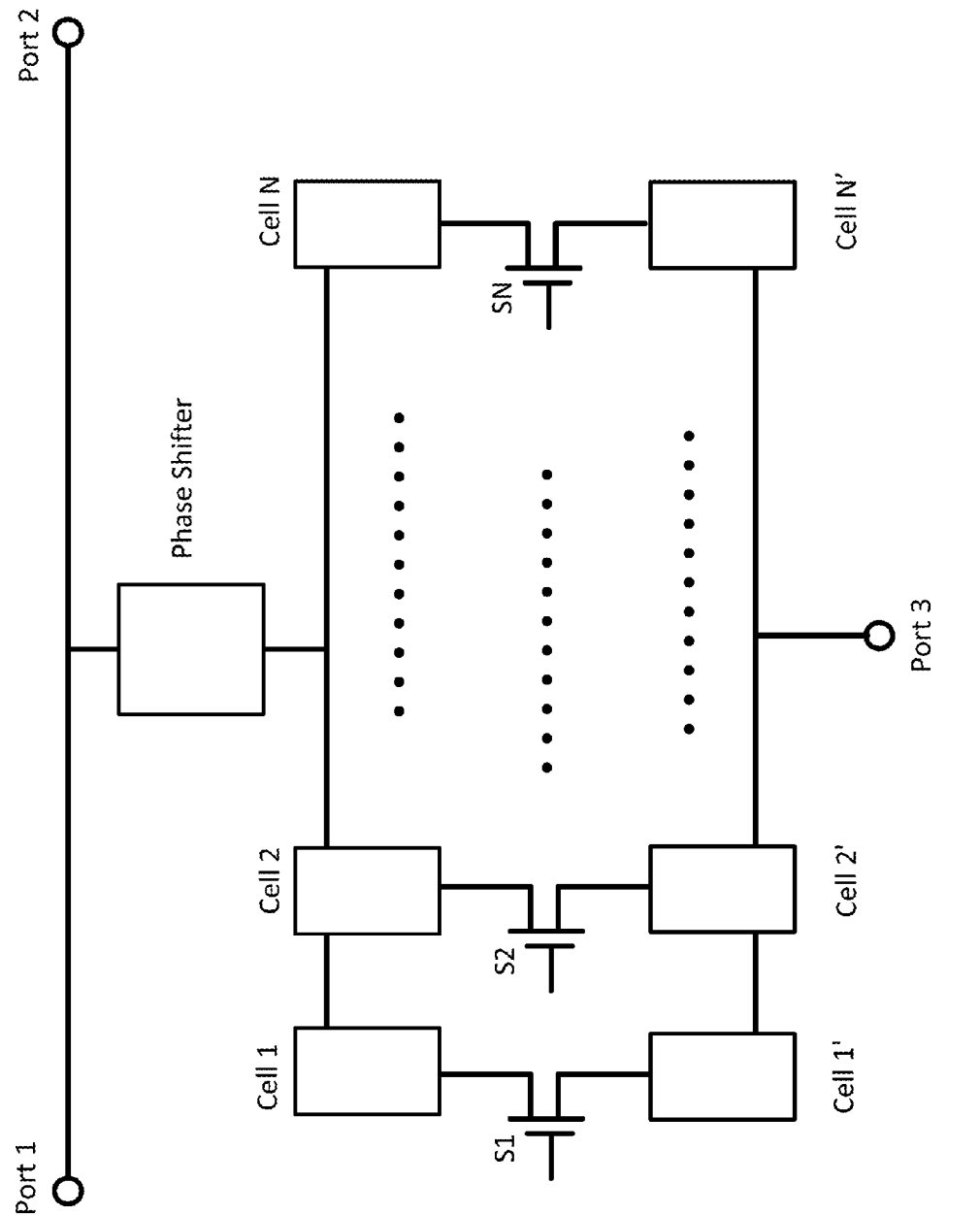
FIG. 20 illustrates an example of the tunable matching network including a phase shifter according to an embodiment.

FIG. 20 illustrates an example of the tunable matching network including a phase shifter according to an embodiment. In this example, one end of the phase shifter is coupled in shunt to the path between ports 1 and 2, which may be coupled to RF+ and RF− or vice versa; and the other end of the phase shifter is coupled to one end of the paralleled braches, each branch having a switch and a first cell on one side of the switch and a second cell on the other side of the switch. The other end of the paralleled branches is coupled to port 3, which may be coupled to other parts of the system, shorted to ground or kept open. The base configuration of FIG. 4H is used in this example; however, any one of or a combination of the configurations illustrated in FIGS. 4A-6D can be used.

Figure 21B:
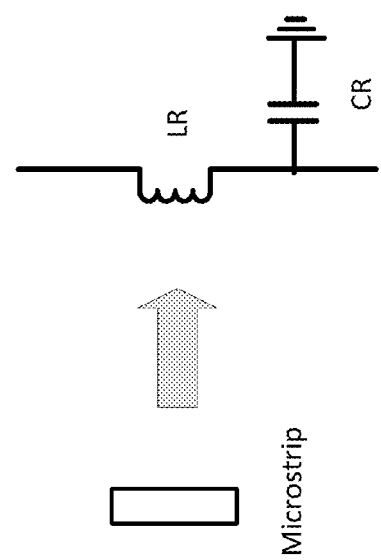
FIG. 21B illustrates an example of an equivalent circuit of the microstrip having the shunt capacitor CR and the series inductance LR.
Figure 21A:
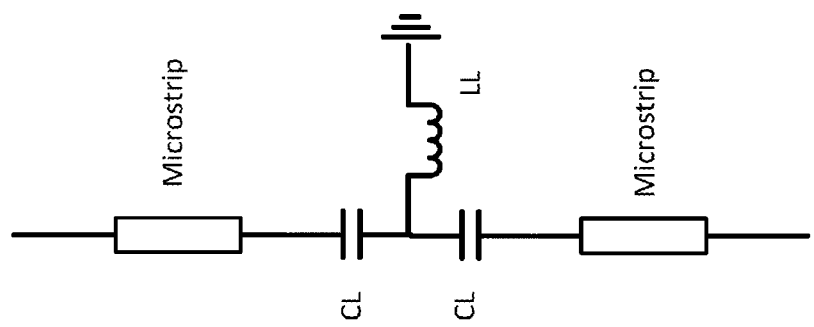
FIG. 21A illustrates an example of the phase shifter based on the CRLH structure.

FIG. 21A illustrates an example of the phase shifter based on the CRLH structure. This example has a shunt inductor LL with one end shorted to ground and the other end coupled in shunt with the path, where each of the upper part and the lower part of the path couples a series capacitor CL and a microstrip, forming a symmetric configuration. In general, a microstrip can be modeled using a shunt capacitor CR and a series inductance LR. FIG. 21B illustrates an example of an equivalent circuit of the microstrip having the shunt capacitor CR and the series inductance LR. The phase shifter in this example is thus configured to have the CRLH structure. A CRLH structure different from the above can be used to form the phase shifter. The values of the capacitors and inductors, LL, CL, LR and CR, can be chosen to provide the phase-versus-frequency CRLH curve in such a way that optimum phases, hence impedance values, can be obtained corresponding to two or more frequency bands simultaneously, as illustrated in FIG. 19.

Figure 22B:
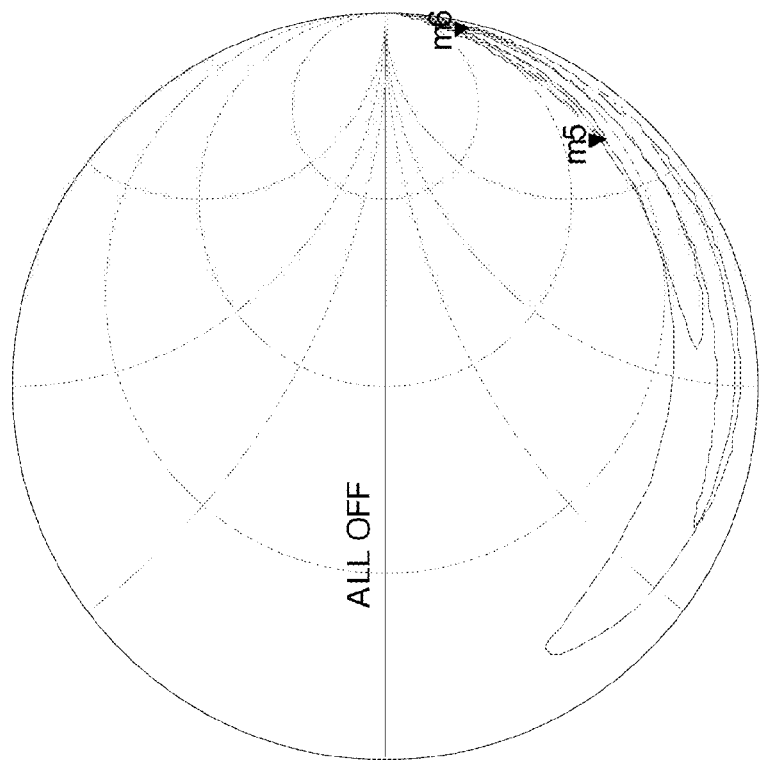
FIG. 22B is the Smith Chart showing two impedance points, m5 and m6, corresponding to 800 MHz and 1.8 GHz, respectively, when all the five switches are off.
Figure 22A:
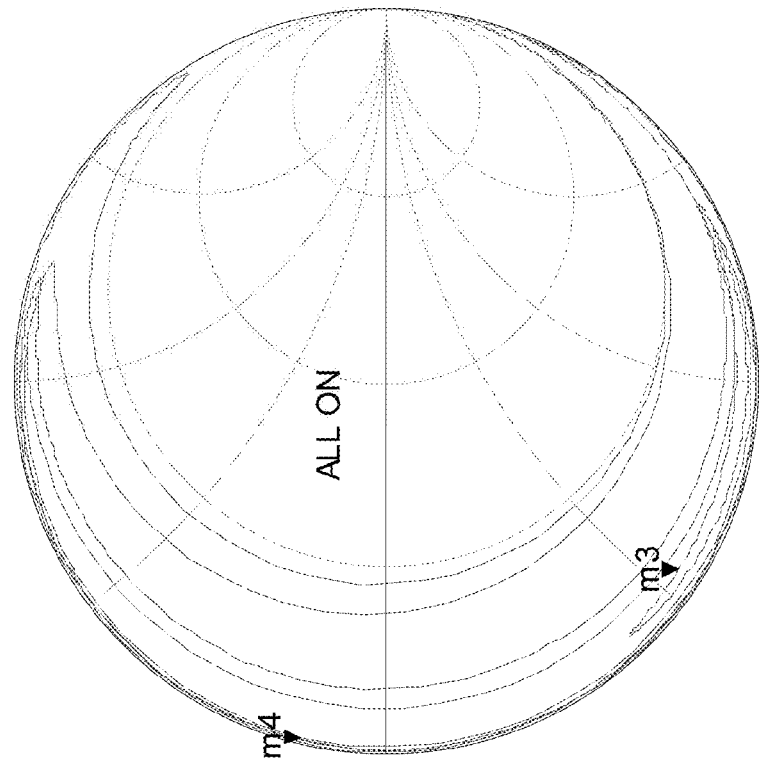

Simulations were carried for the tunable matching network including the phase shifter as designed above and five paralleled branches coupled to the phase shifter in shunt, each branch having a switch, a first capacitor on one side of the switch, and a second capacitor on the other side of the switch. The component values were chosen so as to provide optimum impedances for the two frequencies of 800 MHz and 1.8 GHz when all the five switches are on. FIG. 22A is the Smith Chart showing two impedance points, m3 and m4, corresponding to 1.8 GHz and 800 MHz, respectively, when all the five switches are on. FIG. 22B is the Smith Chart showing two impedance points, m5 and m6, corresponding to 800 MHz and 1.8 GHz, respectively, when all the five switches are off. This simulation result indicates that the tunable matching network including the phase shifter optimally turns the impedance values from the unmatched case of FIG. 22B to the matched case of FIG. 22A for two different frequencies simultaneously.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

What is claimed is:

1. A communication system comprising:
an antenna;
a matching network coupled to the antenna;
a controller configured to control the matching network;
a look-up table, the look-up table including characterization data according to frequency bands and conditions, wherein the controller is configured to refer to the look-up table to determine an impedance for a frequency band selected and under a condition detected during a time interval, and the controller further configured to adjust the matching network to provide the impedance;
one or more sensors configured to detect the condition during the time interval, wherein the controller receives information on the condition from the one or more sensors and uses the information upon referring to the look-up table;
wherein
the matching network comprises a plurality of cells and a plurality of switches coupled to the plurality of cells, wherein each cell comprises one or more components, and wherein
the controller is configured to adjust the matching network by selectively adjusting one or more of the plurality of switches between an on condition and an off condition to select a current state of the matching network from at least three states of the matching network, the at least three states associated with possible configurations of the plurality of switches of the matching network, the current state being selected to provide an impedance for the frequency band and the condition based on component values of one or more of the plurality of cells coupled to the one or more of the plurality of switches that are turned on, the component values having been selected based on parasitic effects to provide a linear impedance behavior with respect to the at least three states associated with possible configurations of the plurality of switches of the matching network.

2. The communication system of claim 1, wherein the matching network comprises a plurality of first cells coupled to a plurality of switches, respectively, wherein each of the plurality of first cells comprises one or more components.

3. The communication system of claim 2, wherein the matching network further comprises:
a plurality of second cells coupled to the plurality of switches, respectively, wherein each of the plurality of second cells comprises one or more components.

4. The communication system of claim 3, wherein the controller is configured to adjust the matching network by adjusting on one or more of the plurality of switches to the on condition to provide the impedance for the band and the condition based on one or more of the plurality of first cells coupled respectively to the one or more of the plurality of switches that in the on condition and one or more of the plurality of second cells coupled respectively to the one or more of the plurality of switches that are in the on condition.

5. The communication system of claim 3, wherein
the plurality of first cells are coupled on one side of the plurality of switches, respectively, and the plurality of second cells are coupled on the other side of the plurality of switches, respectively, wherein
each of the first and second cells comprises one or more capacitors.

6. The communication system of claim 2, wherein
the controller is configured to adjust the matching network by adjusting on one or more of the plurality of switches to the on condition to provide the impedance for the frequency band and the condition based on one or more of the plurality of first cells coupled respectively to the one or more of the plurality of switches that are in the on condition.

7. The communication system of claim 2, wherein the matching network further comprises:
a third cell comprising one or more components, the third cell having a first end portion coupled to a first port of the matching network and a second end portion coupled to a second port of the matching network, wherein
the third cell is in operation to provide the impedance for a nominal condition and a nominal band, and the controller is configured to adjust on one or more of the plurality of switches to the on condition to adjust the impedance when the condition, the band or both of the above changes.

8. The communication system of claim 1, wherein
the matching network comprises a phase shifter coupled to the plurality of switches and the plurality of cells, and wherein
the controller is configured to adjust the matching network by adjusting on one or more of the plurality of switches to the on condition; and
the phase shifter is configured to adjust impedance values provided by one or more of the plurality of cells coupled to the one or more of the plurality of switches that are in the on condition.

9. The communication system of claim 8, wherein
the phase shifter is configured to have a composite right and left hand (CRLH) structure to adjust the impedance values to simultaneously provide two or more impedances for two or more frequency bands, respectively.

10. The communication system of claim 1, wherein
the conditions include environments of the communication system including free space, presence of a head, a hand, laps, wood, metal, or other interference-causing objects, with different positions and angles.

11. The communication system of claim 1, wherein
each cell comprises one or more capacitors, one or more inductors, or a combination of one or more capacitors and one or more inductors.

12. The communication system of claim 1, wherein said one or more sensors are each individually selected from the group consisting of: a proximity sensor, motion sensor, light sensor, or pressure sensor.

* * * * *